(12) United States Patent
Kim et al.

(10) Patent No.: US 12,048,224 B2
(45) Date of Patent: Jul. 23, 2024

(54) DISPLAY DEVICE

(71) Applicant: SAMSUNG DISPLAY CO., LTD., Yongin-si (KR)

(72) Inventors: Hyungbae Kim, Hwaseong-si (KR); Taejoon Kim, Seongnam-si (KR); Jaewoo Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/455,566

(22) Filed: Nov. 18, 2021

(65) Prior Publication Data

US 2022/0271096 A1 Aug. 25, 2022

(30) Foreign Application Priority Data

Feb. 22, 2021 (KR) .......................... 10-2021-0023169

(51) Int. Cl.
*G06F 3/044* (2006.01)
*H10K 50/844* (2023.01)
*H10K 59/40* (2023.01)
*H10K 102/00* (2023.01)

(52) U.S. Cl.
CPC ........... *H10K 59/40* (2023.02); *G06F 3/0446* (2019.05); *H10K 50/844* (2023.02); *G06F 2203/04111* (2013.01); *H10K 2102/311* (2023.02)

(58) Field of Classification Search
CPC ................. H01L 27/323; G06F 3/0446; G06F 2203/04111; G06F 2203/04112; G06F 2203/04103
See application file for complete search history.

(56) References Cited

U.S. PATENT DOCUMENTS

| | | | |
|---|---|---|---|
| 9,768,415 | B2 | 9/2017 | Son et al. |
| 10,553,821 | B2 | 2/2020 | Kang et al. |
| 10,615,485 | B2 | 4/2020 | Chun et al. |
| 10,671,124 | B2 | 6/2020 | Kim et al. |
| 10,782,830 | B2 | 9/2020 | Liu et al. |
| 2021/0020078 | A1 | 1/2021 | Park et al. |
| 2021/0055816 | A1* | 2/2021 | An .................... H01L 51/5253 |
| 2021/0200381 | A1* | 7/2021 | Kang .................... B32B 17/10 |
| 2022/0029131 | A1* | 1/2022 | Jeong .................... G06F 3/0412 |

FOREIGN PATENT DOCUMENTS

| | | |
|---|---|---|
| KR | 10-1649097 | 8/2016 |
| KR | 20170032955 | 3/2017 |
| KR | 10-1936109 | 1/2019 |
| KR | 20190083687 | 7/2019 |
| KR | 10-2060733 | 12/2019 |
| KR | 20210010778 | 1/2021 |

\* cited by examiner

*Primary Examiner* — Dennis P Joseph
(74) *Attorney, Agent, or Firm* — F. CHAU & ASSOCIATES, LLC

(57) ABSTRACT

A display device includes a display panel and an input sensor disposed on the display panel. The input sensor includes a plurality of first areas repeatedly arranged in a first direction, a plurality of second areas repeatedly arranged in the first direction, an inorganic insulating layer disposed in the first areas, an organic insulating layer disposed in the first areas and the second areas, and a sensing electrode disposed on the organic insulating layer. The first areas are alternately arranged in the first direction with the second areas, and the input sensor includes openings in the second areas that are formed by removing portions of the inorganic insulating layer from the second areas.

19 Claims, 22 Drawing Sheets

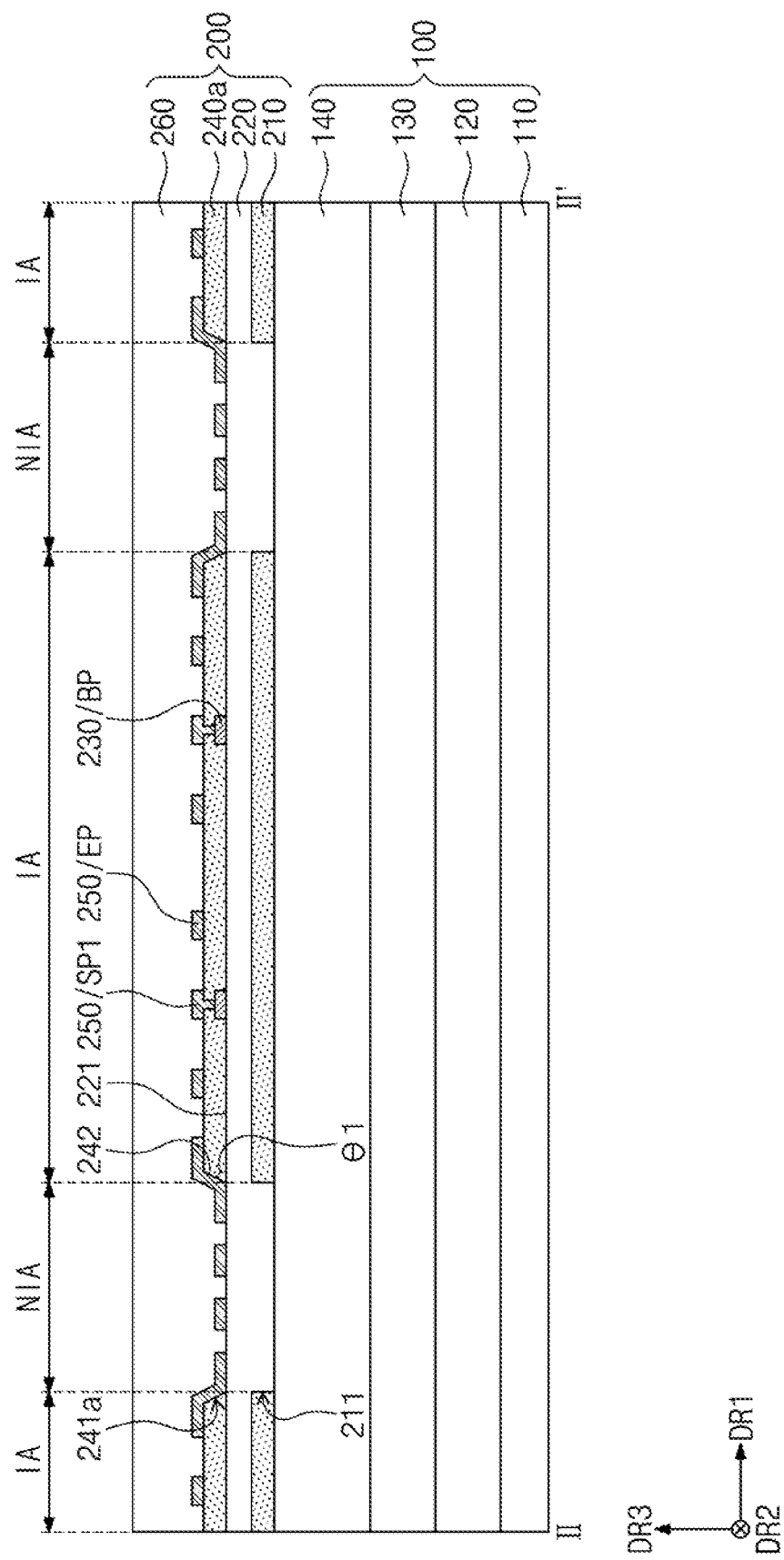

DISPLAY DEVICE

CROSS-REFERENCE TO RELATED APPLICATION

This U.S. non-provisional patent application claims priority under 35 U.S.C. § 119 from Korean Patent Application No. 10-2021-0023169, filed on Feb. 22, 2021 in the Korean Intellectual Property Office, the contents of which are herein incorporated by reference in their entirety.

BACKGROUND

1. Technical Field

Embodiments of the present disclosure are directed to a display device. More particularly, embodiments of the present disclosure are directed to a flexible display device.

2. Discussion of the Related Art

Electronic items that provide images to a user, such as a smartphone, a digital camera, a notebook computer, a navigation unit, or a smart television, include a display device to display the images. The display device generates the images and provides the images to the user through a display screen thereof.

With the continuing development of display device technology, various types of display devices have been developed. For example, various flexible display devices that can be transformed into a curved shape, foldable, or rollable, are being developed. Flexible display devices are easy to carry and improve a user's convenience.

SUMMARY

Embodiments of the present disclosure provide a display device that has improved rolling characteristics and reliability.

Embodiments of the inventive concept provide a display device that includes a display panel and an input sensor disposed on the display panel.

The input sensor includes a plurality of first areas repeatedly arranged in a first direction, a plurality of second areas repeatedly arranged in the first direction, an inorganic insulating layer disposed in the first areas, an organic insulating layer disposed in the first areas and the second areas, and a sensing electrode disposed on the organic insulating layer.

The first areas are alternately arranged in the first direction with the second areas, and the input sensor includes openings in the second areas that are formed by removing portions of the inorganic insulating layer from the second areas.

Embodiments of the inventive concept provide a display device that includes a display panel that includes a light emitting element layer and an encapsulation layer disposed on the light emitting element layer, and an input sensor disposed on the encapsulation layer.

The input sensor includes a plurality of first areas repeatedly arranged in a first direction, a plurality of second areas repeatedly arranged in the first direction, an organic insulating layer disposed in the first areas and the second areas, a plurality of first inorganic insulating layers disposed on the organic insulating layer in the first areas, a second inorganic insulating layer disposed in the second areas, and a sensing electrode disposed on the organic insulating layer.

The first areas are alternately arranged in the first direction with the second areas, and the input sensor includes openings in the second areas that are formed by removing portions of the first and second inorganic insulating layers from the second areas.

Embodiments of the inventive concept provide a display device that includes a display panel, and an input sensor disposed on the display panel.

The input sensor includes a sensing area that senses an input signal, a non-sensing area that surrounds the sensing area, a plurality of inorganic insulating layers disposed in the sensing area, an organic insulating layer disposed on the plurality of inorganic insulating layers. and a sensing electrode disposed on the organic insulating layer.

The plurality of inorganic insulating layers are spaced apart from each other in a first direction by a plurality of openings, each of the plurality of inorganic insulating layers and each of the openings extends in a second direction that crosses the first direction, and a width of each of the plurality of openings increases in the first direction.

According to the above, as different portions of the inorganic insulating layer are removed along a rolling direction in the input sensor, the first areas where the inorganic insulating layer is disposed are alternately arranged with the second areas where the inorganic insulating layer is not disposed. Thus, when the display device is rolled along the rolling direction, stress applied to the display panel and the input sensor is relieved. Accordingly, the rolling characteristics and the reliability of the display device are improved.

BRIEF DESCRIPTION OF THE DRAWINGS

FIGS. 7A to 7C are cross-sectional views of a display device taken along line II-II' in FIG. 6 according to embodiments of the present disclosure.

DETAILED DESCRIPTION

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout.

Hereinafter, embodiments of the present disclosure will be explained in detail with reference to the accompanying drawings.

Figure 1:
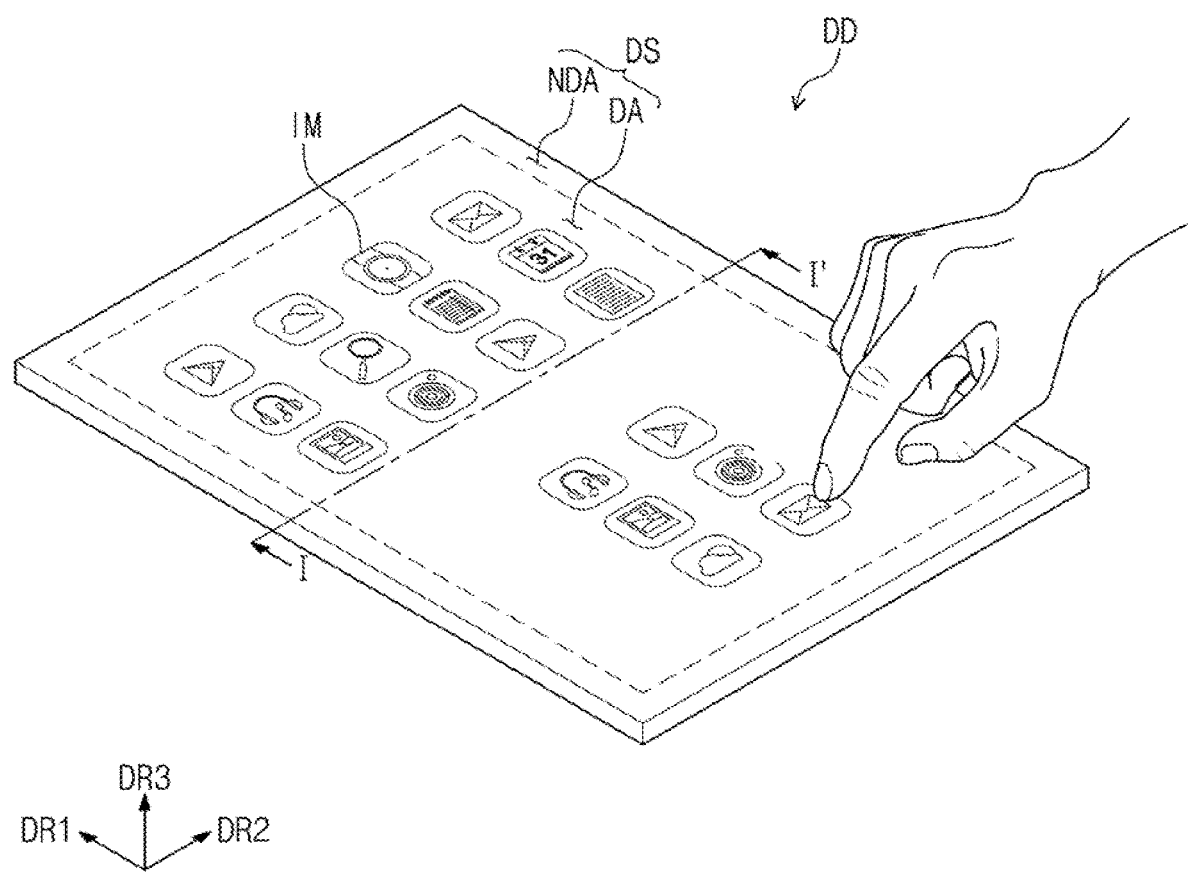
FIG. 1 is a perspective view of a display device according to an embodiment of the present disclosure.
Figure 2:
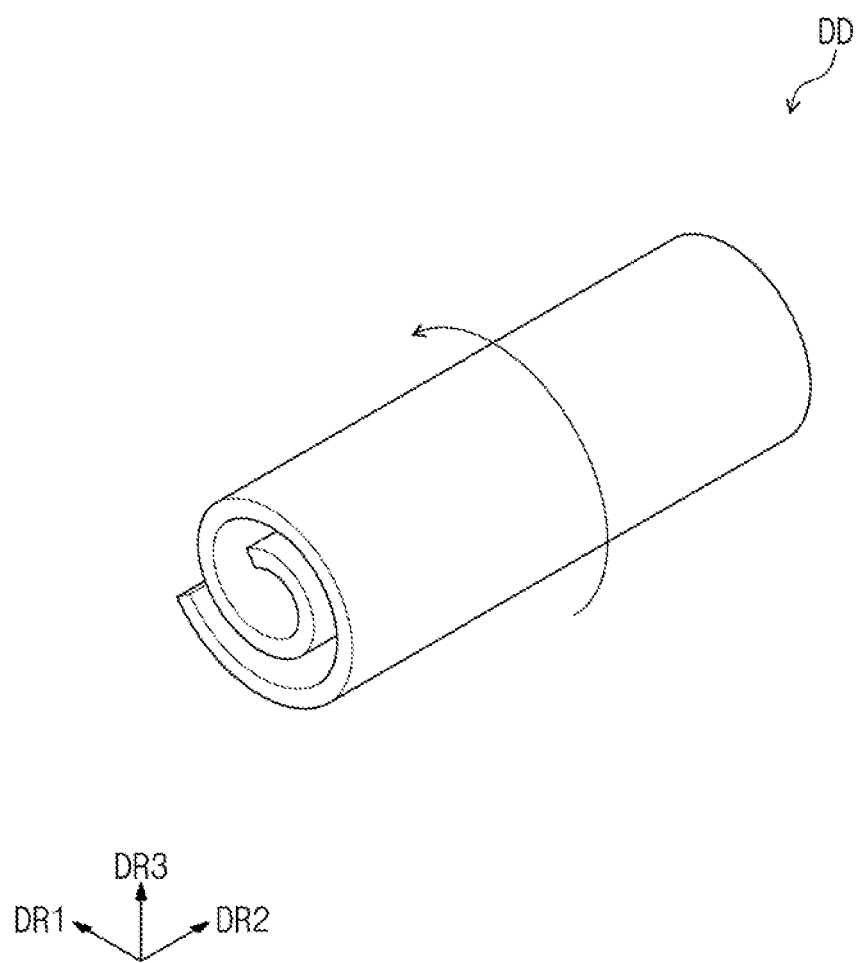
FIG. 2 shows a display device shown in FIG. 1 in a rolled state.

FIG. 1 is a perspective view of a display device DD according to an embodiment of the present disclosure, and FIG. 2 shows the display device DD of FIG. 1 in a rolled state.

Referring to FIG. 1, the display device DD according to the embodiment of the present disclosure has a rectangular shape defined by long sides that extend in a first direction DR1 and short sides that extend in a second direction DR2 that crosses the first direction DR1. However, embodiments are not limited of the display device DD are limited to a rectangular shape, and in other embodiments, the display device DD may have different shapes, such as a circular shape or a polygonal shape.

A direction substantially perpendicular to a plane defined by the first direction DR1 and the second direction DR2 is referred to as a third direction DR3. In a present embodiment, the expression "when viewed in a plane" refers to a state of being viewed in the third direction DR3.

In an embodiment, an upper surface of the display device DD is referred to as a display surface DS and is substantially parallel to the plane defined by the first direction DR1 and the second direction DR2. Images IM generated by the display device DD are displayed to a user through the display surface DS.

In an embodiment, the display surface DS includes a display area DA and a non-display area NDA around the display area DA. The display area DA displays an image, and the non-display area NDA does not display an image. The non-display area NDA surrounds the display area DA and forms an edge of the display device DD, which has a predetermined color.

In an embodiment, the display device DD can be incorporated into a large-sized electronic item, such as a television set, a monitor, or an outdoor billboard, etc. In addition, the display device DD can be incorporated into a small and medium-sized electronic item, such as a personal computer, a notebook computer, a personal digital assistant, a navigation unit, a game unit, a smartphone, a tablet computer, or a camera, etc. However, this are merely examples, and the display device DD can be incorporated into other electronic items as long as they do not depart from the inventive concept of embodiments of the present disclosure.

Referring to FIG. 2, in an embodiment, the display device DD is a flexible display device that can be rolled. For example, the display device DD is a rollable display device.

In an embodiment, the display device DD can be rolled in the first direction DR1. The display device DD can be rolled into a cylindrical shape. A user can carry the display device DD after rolling the display device DD, and since the user can, if necessary, unfold the display device DD and view images, a portability of the display device DD is improved.

Figure 3:
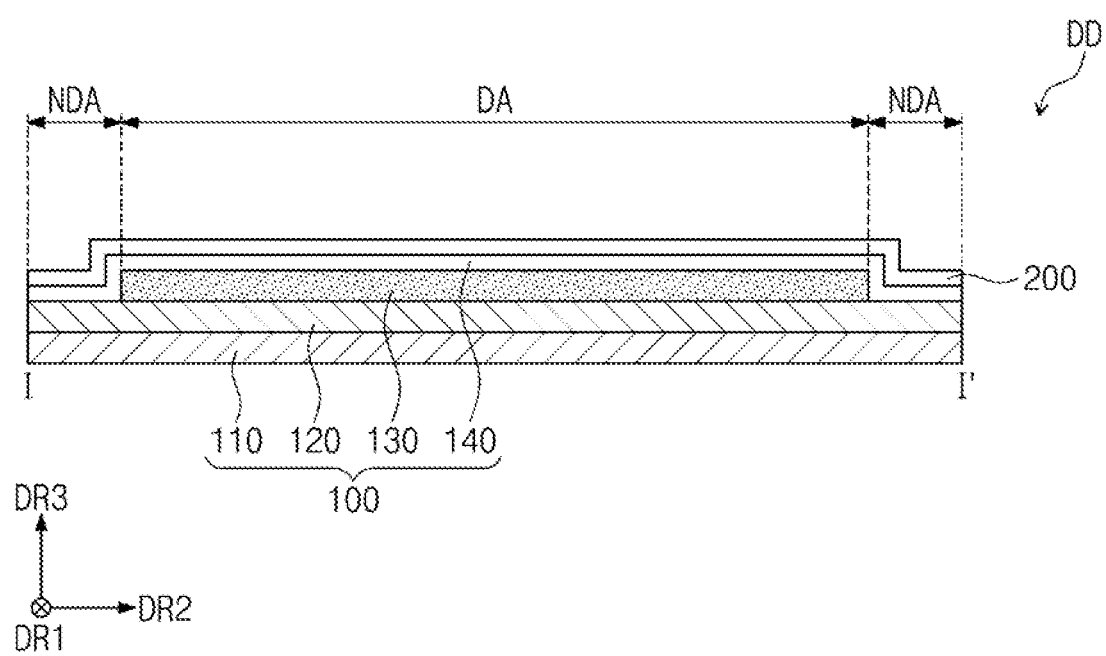
FIG. 3 is a cross-sectional view taken along line I-I' in FIG. 1.

FIG. 3 is a cross-sectional view taken along line I-I' in FIG. 1.

Referring to FIG. 3, in an embodiment, the display device DD includes a display panel 100 and an input sensor 200. The display panel 100 includes a base layer 110, a circuit layer 120, a light emitting element layer 130, and an encapsulation layer 140.

In an embodiment, the base layer 110 provides a base surface on which the circuit layer 120 is disposed. The base layer 110 may be a glass substrate, a metal substrate, or a polymer substrate. However, embodiments are not limited thereto, and in other embodiment, the base layer 110 may be an inorganic layer, an organic layer, or a composite material layer.

In an embodiment, the base layer 110 has a multi-layer structure. For example, the base layer 110 includes a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

In an embodiment, each of the first and second synthetic resin layers includes a polyimide-based resin. In addition, each of the first and second synthetic resin layers includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin.

In an embodiment, the circuit layer 120 is disposed on the base layer 110. The circuit layer 120 includes an insulating layer, a semiconductor pattern, a conductive pattern, and a signal line. An insulating layer, a semiconductor layer, and a conductive layer can be formed on the base layer 110 by a coating or depositing process. Then, the insulating layer, the semiconductor layer, and the conductive layer are selectively patterned through several photolithography processes. Thus, the semiconductor pattern, the conductive pattern, and the signal line in the circuit layer 120 are formed.

In an embodiment, the light emitting element layer 130 is disposed on the circuit layer 120. The light emitting element layer 130 includes a light emitting element. For example, the light emitting element layer 130 may be one of an organic light emitting material, a quantum dot, a quantum rod, a micro-LED, or a nano-LED.

In an embodiment, the encapsulation layer 140 is disposed on the light emitting element layer 130. The encapsulation layer 140 protects the light emitting element layer 130 from moisture, oxygen, and foreign substances such as dust particles.

In an embodiment, the input sensor 200 is disposed on the display panel 100. In particular, the input sensor 200 is disposed on the encapsulation layer 140 of the display panel 100. The input sensor 200 can sense an external input applied thereto. The external input may be a user input. The user input includes any one of a variety of external inputs, such as those caused by a part of user's body, light, heat, pen, or pressure, etc.

In an embodiment, the input sensor 200 is formed on the display panel 100 through successive processes. The input sensor 200 is disposed directly on the display panel 100. In the following descriptions, the expression "the input sensor 200 is directly disposed on the display panel 100" means that no intervening elements are present between the input sensor 200 and the display panel 100. That is, no separate adhesive member is disposed between the input sensor 200 and the display panel 100. Alternatively, in other embodiments, the input sensor 200 can be coupled with the display panel 100 by an adhesive member. The adhesive member may be an ordinary adhesive.

In an embodiment, the display device DD further includes an anti-reflective layer and an optical layer that are disposed on the input sensor 200. The anti-reflective layer reduces reflectance of external light incident thereto. The optical layer controls a direction in which light from the display panel 100 propagates, and thus increases a front luminance of the display device DD.

Figure 4:
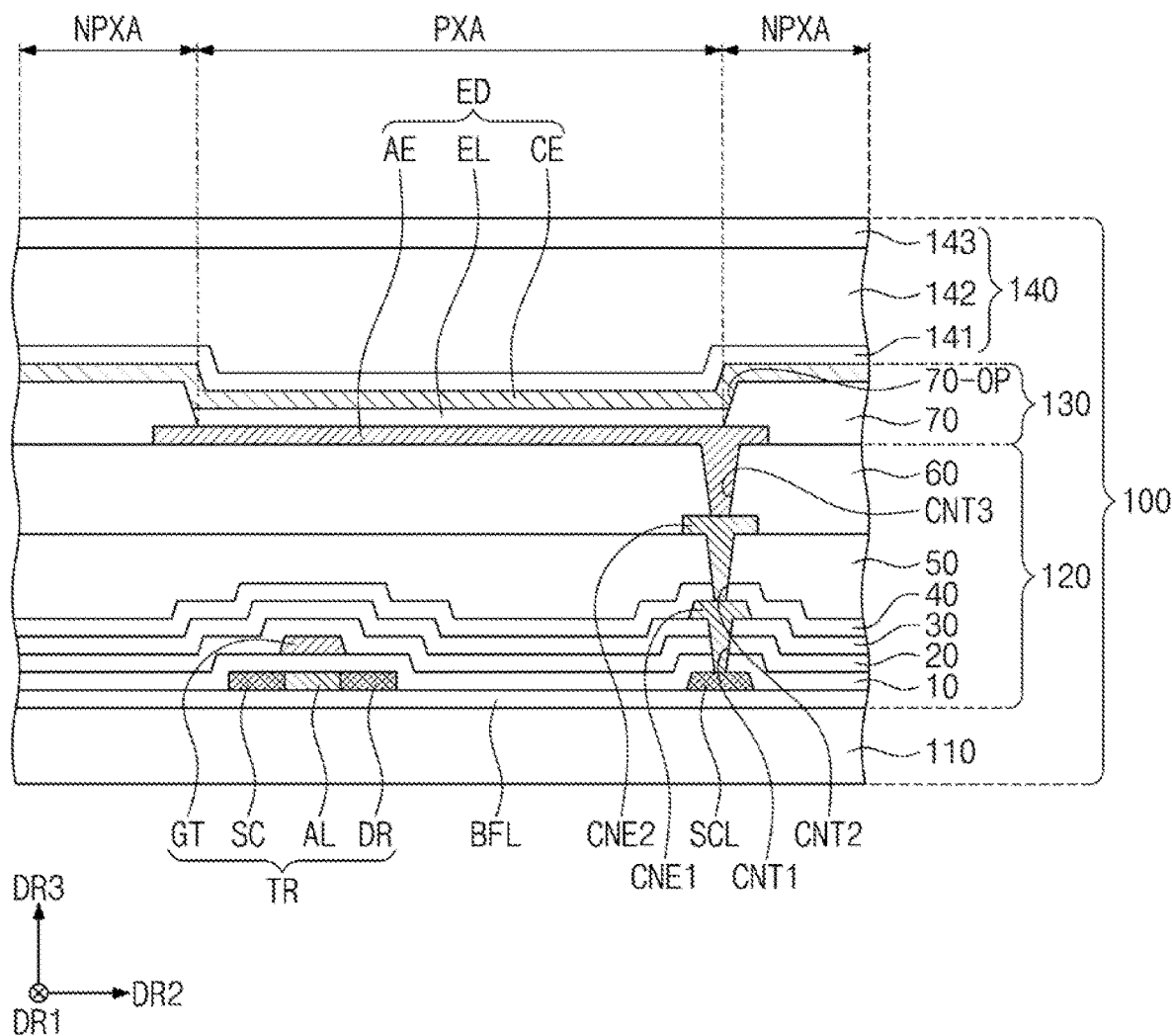
FIG. 4 is a cross-sectional view of a display panel according to an embodiment of the present disclosure.

FIG. 4 is a cross-sectional view of the display panel 100 according to an embodiment of the present disclosure.

Referring to FIG. 4, in an embodiment, at least one inorganic layer is formed on an upper surface of the base layer 110. The inorganic layer includes at least one of aluminum oxide, titanium oxide, silicon oxide, silicon nitride, silicon oxynitride, zirconium oxide, or hafnium oxide. The inorganic layer is formed in multiple layers. The multiple inorganic layers form a barrier layer and/or a buffer layer. In a present embodiment, the display panel 100 includes a buffer layer BFL.

In an embodiment, the buffer layer BFL increases a coupling force between the base layer 110 and a semiconductor pattern. The buffer layer BFL includes at least one of silicon oxide, silicon nitride, or silicon oxynitride. For example, the buffer layer BFL has a structure in which a silicon oxide layer and a silicon nitride layer are alternately stacked with each other.

In an embodiment, the semiconductor pattern is disposed on the buffer layer BFL. The semiconductor pattern includes polysilicon, however, embodiments are not limited thereto. In other embodiments, the semiconductor pattern may include amorphous silicon, low-temperature polycrystalline silicon, or oxide semiconductor.

FIG. 4 shows only a portion of the semiconductor pattern, and the semiconductor pattern is also disposed in other areas. The semiconductor pattern is arranged with a specific rule over pixels. The semiconductor pattern can have different electrical properties depending on whether or not it is doped, or whether it is doped with an N-type dopant or a P-type dopant. The semiconductor pattern includes a first region with high conductivity and a second region with low conductivity. The first region is doped with an N-type dopant or a P-type dopant. A P-type transistor includes a doped region doped with a P-type dopant, and an N-type transistor includes a doped region doped with an N-type dopant. The second region is a non-doped region or may be doped at a concentration lower than the high conductivity region.

In an embodiment, the first region has a conductivity that is greater than that of the second region and serves as an electrode or a signal line. The second region corresponds to an active region (or a channel) of the transistor. In other words, a portion of the semiconductor pattern is the active region of the transistor, another portion of the semiconductor pattern is a source or a drain of the transistor, and the other portion of the semiconductor pattern is a connection electrode or a connection signal line.

In an embodiment, each of the pixels has an equivalent circuit that includes seven transistors, one capacitor, and a light emitting element, and the equivalent circuit of the pixels may change in various ways. FIG. 4 shows one transistor TR and the light emitting element ED included in the pixel.

A source SC, an active region AL, and a drain DR are formed from the semiconductor pattern. The source SC and the drain DR extend in opposite directions to each other from the active region AL in a cross-sectional view. FIG. 4 shows a portion of a connection signal line SCL formed from the semiconductor pattern. The connection signal line SCL is electrically connected to the drain DR of the transistor TR.

In an embodiment, a first insulating layer 10 is disposed on the buffer layer BFL. The first insulating layer 10 commonly overlaps the pixels and covers the semiconductor pattern. The first insulating layer 10 may be an inorganic layer and/or an organic layer and may have a single-layer or a multi-layer structure. The first insulating layer 10 includes at least one of aluminum oxide, titanium oxide, silicon oxide, silicon nitride, silicon oxynitride, zirconium oxide, or hafnium oxide. In a present embodiment, the first insulating layer 10 has a single-layer structure of silicon oxide. In addition to the first insulating layer 10, an insulating layer of the circuit layer 120 described below may be an inorganic layer and/or an organic layer and may have a single-layer or a multi-layer structure. The inorganic layer includes at least one of the above-mentioned materials, however, embodiments are not limited thereto.

In an embodiment, a gate GT of the transistor TR is disposed on the first insulating layer 10. The gate GT is a portion of a metal pattern. The gate GT overlaps the active region AL. The gate GT can be used as a mask in a process of doping the semiconductor pattern.

In an embodiment, a second insulating layer 20 is disposed on the first insulating layer 10 and covers the gate GT. The second insulating layer 20 commonly overlaps the pixels. The second insulating layer 20 may be an inorganic layer and/or an organic layer and may have a single-layer or a multi-layer structure. The second insulating layer 20 includes at least one of silicon oxide, silicon nitride, or silicon oxynitride. In a present embodiment, the second insulating layer 20 has a multi-layer structure of silicon oxide and silicon nitride.

In an embodiment, a third insulating layer 30 is disposed on the second insulating layer 20. The third insulating layer 30 may have a single-layer structure or a multi-layer structure. For example, the third insulating layer 30 has a multi-layer structure of silicon oxide and silicon nitride.

In an embodiment, a first connection electrode CNE1 is disposed on the third insulating layer 30. The first connection electrode CNE1 is connected to the connection signal line SCL through a first contact hole CNT1 that penetrates through the first, second, and third insulating layers 10, 20, and 30.

In an embodiment, a fourth insulating layer 40 is disposed on the third insulating layer 30. The fourth insulating layer 40 has a single-layer structure of silicon oxide. A fifth insulating layer 50 is disposed on the fourth insulating layer 40. The fifth insulating layer 50 is an organic layer.

In an embodiment, a second connection electrode CNE2 is disposed on the fifth insulating layer 50. The second connection electrode CNE2 is connected to the first connection electrode CNE1 through a second contact hole CNT2 that penetrates through the fourth insulating layer 40 and the fifth insulating layer 50.

In an embodiment, a sixth insulating layer 60 is disposed on the fifth insulating layer 50 and covers the second connection electrode CNE2. The sixth insulating layer 60 is an organic layer.

In an embodiment, the light emitting element layer 130 is disposed on the circuit layer 120. The light emitting element layer 130 is disposed on the sixth insulating layer 60 of the circuit layer 120. The light emitting element layer 130 includes the light emitting element ED. For example, the light emitting element layer 130 includes at least one of an organic light emitting material, an inorganic light emitting material, a quantum dot, a quantum rod, a micro-LED, or a nano-LED. Hereinafter, for simplicity of description, the light emitting element ED will be described in terms of an organic light emitting element, however, embodiments of the light emitting element are not limited thereto.

In an embodiment, the light emitting element ED includes a first electrode AE, a light emitting layer EL, and a second electrode CE.

In an embodiment, the first electrode AE is disposed on the sixth insulating layer 60. The first electrode AE is connected to the second connection electrode CNE2 through a third contact hole CNT3 that penetrates through the sixth insulating layer 60.

In an embodiment, the light emitting element layer 130 includes a pixel definition layer 70. The pixel definition layer 70 is disposed on the sixth insulating layer 60 and covers a portion of the first electrode AE. A pixel opening 70-OP is formed through the pixel definition layer 70. At least a portion of the first electrode AE is exposed through the pixel opening 70-OP of the pixel definition layer 70.

In an embodiment, the display area DA includes a light emitting area PXA and a non-light-emitting area NPXA adjacent to the light emitting area PXA. The non-light-emitting area NPXA surrounds the light emitting area PXA. In a present embodiment, the light emitting area PXA corresponds to the portion of the first electrode AE exposed through the pixel opening 70-OP.

In an embodiment, the light emitting layer EL is disposed on the first electrode AE. The light emitting layer EL is disposed in an area that corresponds to the pixel opening 70-OP. That is, the light emitting layer EL is formed in each of the pixels after being divided into a plurality of portions. When the light emitting layer EL is formed in each of the pixels after being divided into a plurality of portions, each of the light emitting layers EL emits at least one of blue, red, or green light, however, embodiments are not limited thereto. Alternatively, according to an embodiment, the light emitting layer EL is integrally connected and commonly provided over the pixels. In this case, the light emitting layer EL emits blue or white light.

In an embodiment, the second electrode CE is disposed on the light emitting layer EL and the pixel definition layer 70. The second electrode CE has an integral shape and is commonly disposed over the pixels.

In an embodiment, a hole control layer is disposed between the first electrode AE and the light emitting layer EL. The hole control layer is commonly disposed in the light emitting area PXA and the non-light-emitting area NPXA. The hole control layer includes a hole transport layer and may further include a hole injection layer. In addition, an electron control layer is disposed between the light emitting layer EL and the second electrode CE. The electron control layer includes an electron transport layer and may further include an electron injection layer. The hole control layer and the electron control layer can each be commonly formed in the pixels using an open mask.

In an embodiment, the encapsulation layer 140 is disposed on the light emitting element layer 130. The encapsulation layer 140 is disposed on the second electrode CE of the light emitting element layer 130. The encapsulation layer 140 includes a first inorganic layer 141, an organic layer 142, and a second inorganic layer 143, which are sequentially stacked, however, embodiments of the encapsulation layer 140 are not limited thereto.

In an embodiment, the first and second inorganic layers 141 and 143 protect the light emitting element layer 130 from moisture and oxygen, and the organic layer 142 protects the light emitting element layer 130 from foreign substances such as dust particles. Each of the first and second inorganic layers 141 and 143 includes at least one of a silicon nitride layer, a silicon oxynitride layer, a silicon oxide layer, a titanium oxide layer, or an aluminum oxide layer. The organic layer 142 includes an acrylic-based organic layer, however, embodiments are not limited thereto.

Figure 5:
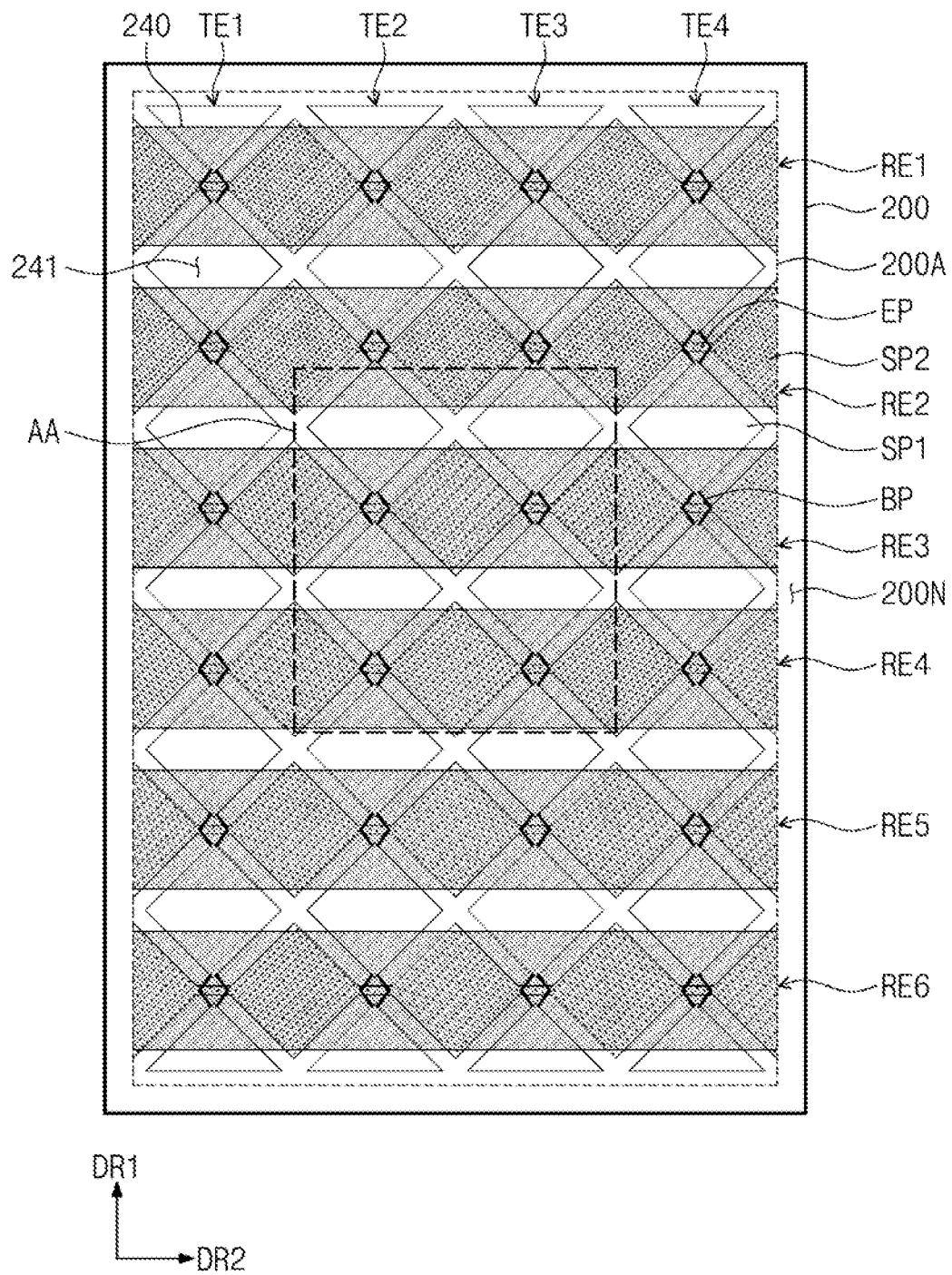
FIG. 5 is a plan view of an input sensor according to an embodiment of the present disclosure.
Figure 6:
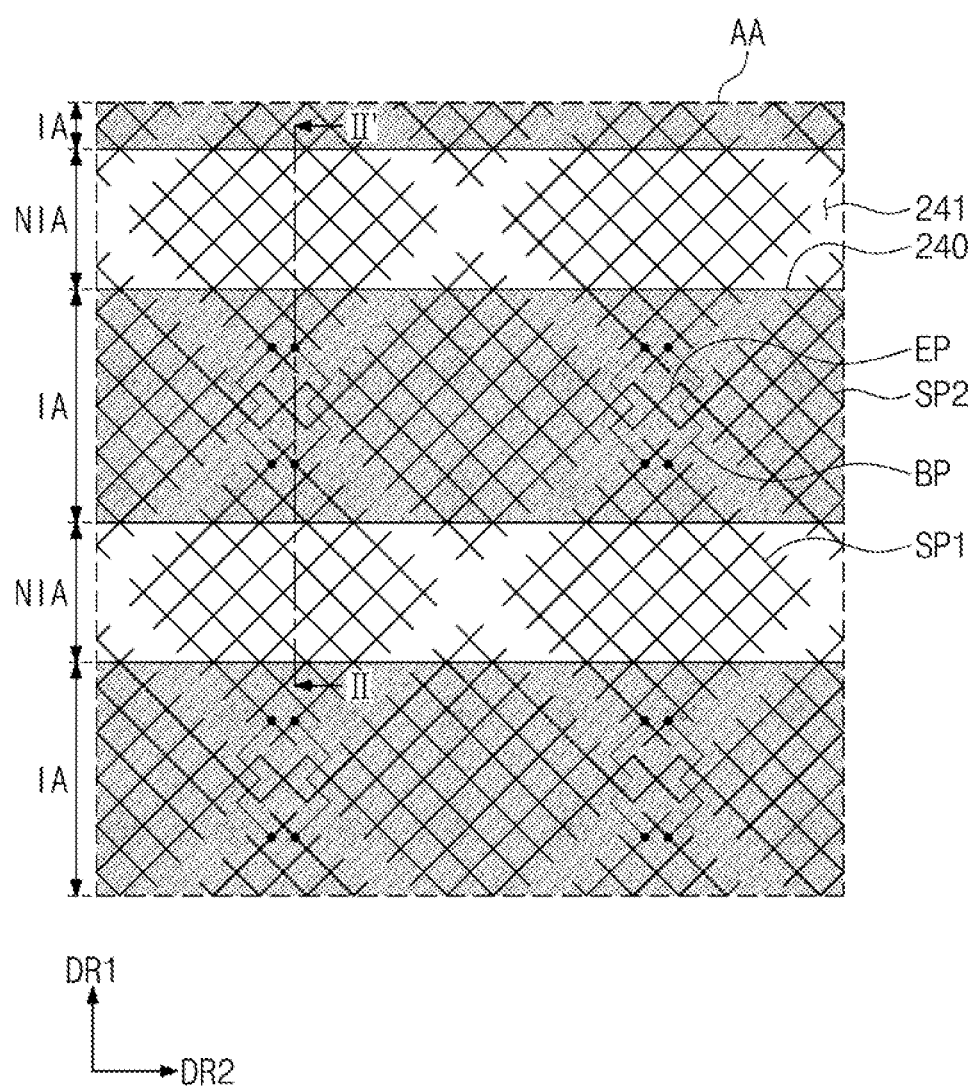
FIG. 6 is an enlarged plan view of portion AA in FIG. 5 according to an embodiment of the present disclosure.
Figure 7A:
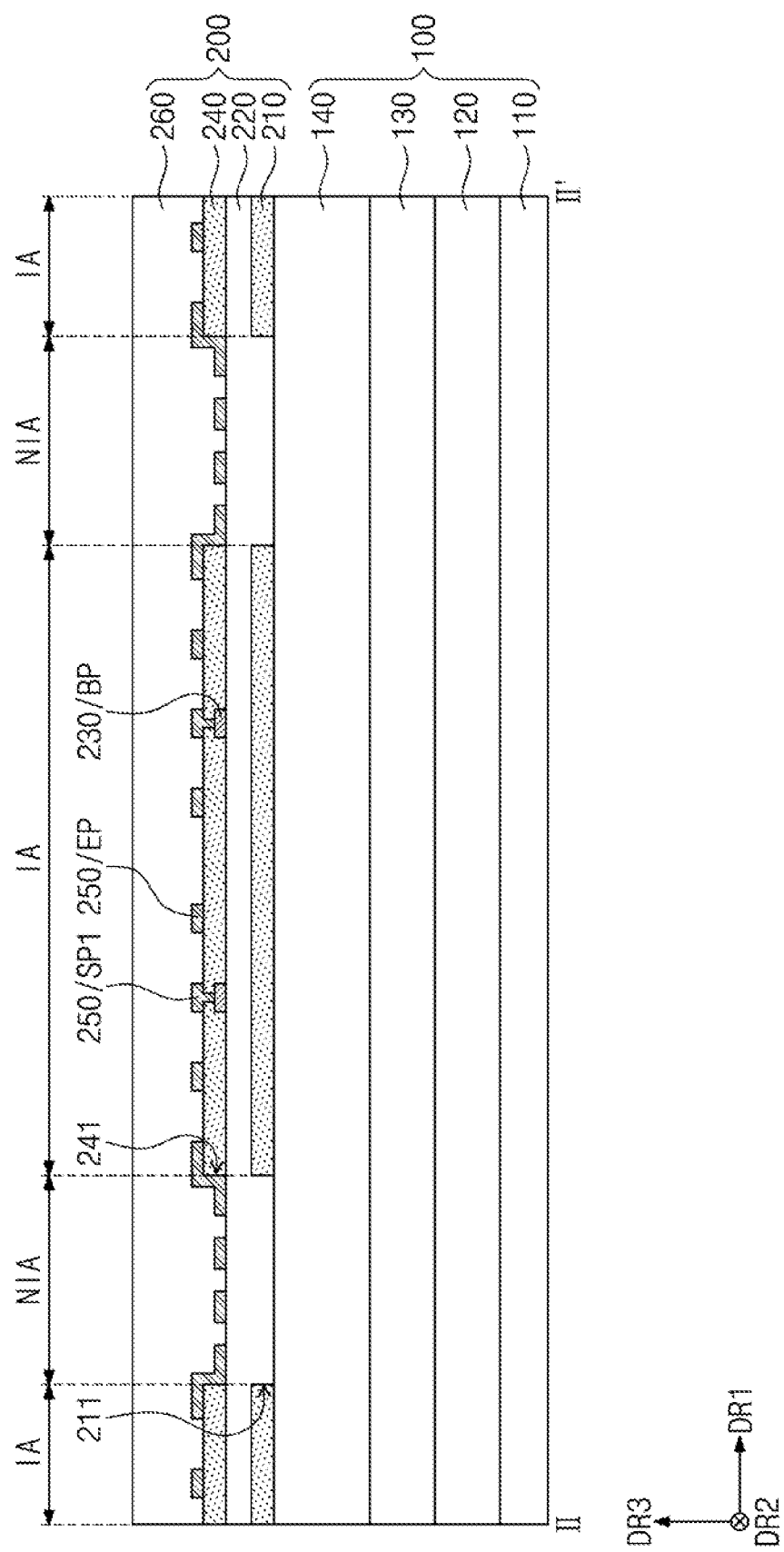
Figure 7C:
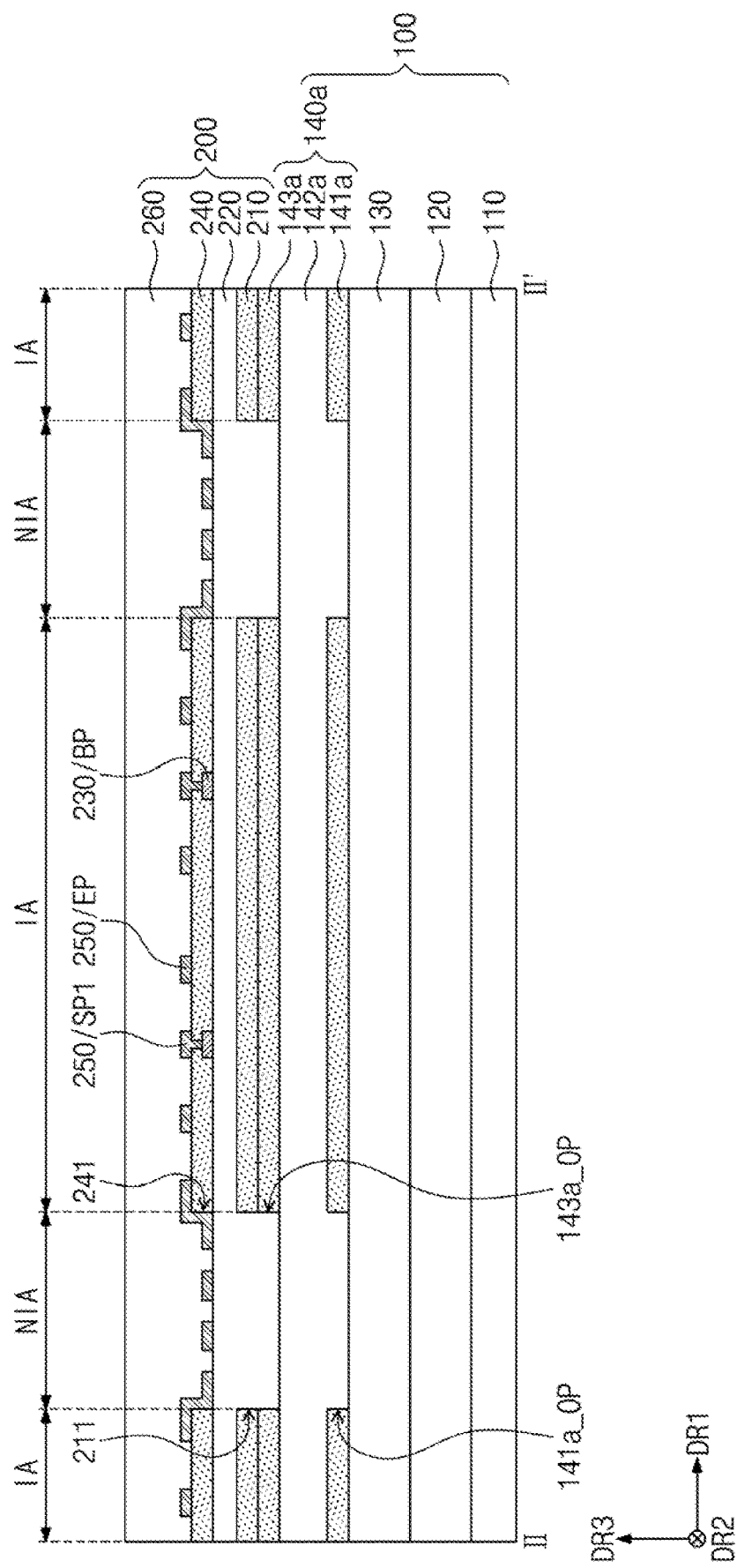

FIG. 5 is a plan view of the input sensor 200 according to an embodiment of the present disclosure. FIG. 6 is an enlarged plan view of portion AA in FIG. 5 according to an embodiment of the present disclosure, and FIGS. 7A to 7C are cross-sectional views of display devices taken along line II-IF FIG. 6*according* to embodiments of the present disclosure.

Referring to FIGS. 5 and 6, according to an embodiment, the input sensor 200 includes a sensing area 200A and a non-sensing area 200N. The sensing area 200A is activated in response to electrical signals. For example, the sensing area 200A is where inputs are sensed, i.e., the sensing area senses an input signal. The sensing area 200A overlaps the display area DA of the display device DD. The non-sensing area 200N surrounds the sensing area 200A. The non-sensing area 200N overlaps the non-display area NDA of the display device DD.

In an embodiment, the sensing area 200A includes a plurality of first areas IA and a plurality of second areas NIA. The first areas IA are repeatedly arranged in the first direction DR1, and the second areas NIA are repeatedly arranged in the first direction DR1. The first areas IA and the second areas NIA alternate with each other in the first direction. The first direction DR1 is substantially parallel to a rolling direction of the display device DD. When the rolling direction of the display device DD is substantially parallel to the second direction DR2, the first and second areas IA and NIA are repeatedly arranged in the second direction DR2. That is, an arrangement direction of the first and second areas IA and NIA is determined based on the rolling direction of the display device DD.

In an embodiment, the first areas IA is where an inorganic insulating layer 240 is disposed, and the second areas NIA are where no inorganic insulating layer 240 is disposed. In addition, the inorganic insulating layer 240 is not disposed in the non-sensing area 200N. The inorganic insulating layer 240 and the first and second areas IA and NIA will be described in detail below.

In an embodiment, the input sensor 200 includes a plurality of first sensing electrodes TE1 to TE4 and a plurality of second sensing electrodes RE1 to RE6. The first sensing electrodes TE1 to TE4 extend in the first direction DR1 and are arranged in the first second DR2. The second sensing electrodes RE1 to RE6 extend in the second direction DR2 and are arranged in the first direction DR1. The first sensing electrodes TE1 to TE4 cross the second sensing electrodes RE1 to RE6. A capacitance is formed between the first sensing electrodes TE1 to TE4 and the second sensing electrodes RE1 to RE6. Although four first sensing electrodes TE1 to TE4 and six second sensing electrodes RE1 to RE6 are shown in FIG. 5, this is for convenience of illustration, and embodiments are not limited thereto, and the number of the first and second sensing electrodes TE1 to TE4 and RE1 to RE6 included in the input sensor 200 can vary.

In an embodiment, the input sensor 200 further includes a plurality of first signal lines connected to the first sensing electrodes TE1 to TE4 and a plurality of second signal lines connected to the second sensing electrodes RE1 to RE6. The first and second signal lines are disposed in the non-sensing area 200N.

In an embodiment, each of the first sensing electrodes TE1 to TE4 includes a plurality of first sensing portions SP1 and bridge portions BP. Two adjacent first sensing portions SP1 are electrically connected to each other by a bridge portion BP, however, embodiments are not limited thereto. The first sensing portions SP1 are disposed on a different layer from a layer on which the bridge portion BP is disposed.

In an embodiment, each of the second sensing electrodes RE1 to RE6 includes a plurality of second sensing portions SP2 and extension portions EP. The second sensing portions SP2 are integrally provided with the extension portions EP and are disposed on the same layer as the extension portions EP. The extension portion extends between two adjacent second sensing portions. The bridge portion BP and the extension portion EP are disposed at crossing portions of the first and second sensing electrodes TE1 to TE4 and RE1 to RE6, and the bridge portion BP is insulated from the extension portion EP when crossing the extension portion EP in the crossing portions.

Referring to FIG. 6, in an embodiment, each of the first sensing portions SP1 has a polygonal shape. For example, each of the first sensing portions SP1 has a diamond shape. However, embodiments are not limited thereto, and the shape of each of the first sensing portions SP1 is not particularly limited.

In an embodiment, each of the first sensing portions SP1 has a mesh shape. Each of the first sensing portions SP1 includes a plurality of first mesh lines, and each of the first mesh lines extends in a direction inclined with respect to the first direction DR1 or the second direction DR2. The extension direction of each of the first mesh lines is not particularly limited. For example, each of the first mesh lines may extend in a direction substantially parallel to the first direction DR1 or the second direction DR2.

In an embodiment, each of the second sensing portions SP2 has a polygonal shape. For example, each of the second sensing portions SP2 has a diamond shape. However, embodiments are not limited thereto, and the shape of each of the second sensing portion SP2 is not particularly limited.

In an embodiment, each of the second sensing portions SP2 has a mesh shape. Each of the second sensing portions SP2 includes a plurality of second mesh lines, and each of the second mesh lines extends in a direction inclined with respect to the first direction DR1 or the second direction DR2. The extension direction of each of the second mesh lines is not particularly limited. For example, each of the second mesh lines may extend in a direction substantially parallel to the first direction DR1 or the second direction DR2.

Referring to FIGS. 6 and 7A, in an embodiment, the input sensor 200 is disposed on the display panel 100. The input sensor 200 is disposed directly on the encapsulation layer 140. That is, no third member is disposed between the input sensor 200 and the encapsulation layer 140.

In an embodiment, the input sensor 200 includes a base insulating layer 210, an organic insulating layer 220, a first conductive layer 230, an inorganic insulating layer 240, a second conductive layer 250, and a protective insulating layer 260.

In an embodiment, the base insulating layer 210 is disposed directly on the encapsulation layer 140. The base insulating layer 210 is an inorganic layer that includes at least one of silicon nitride, silicon oxynitride, or silicon oxide. The base insulating layer 210 may have a single-layer structure or a multi-layer structure of layers stacked in the third direction DR3.

In an embodiment, the base insulating layer 210 is disposed in the first areas IA but is not disposed in the second areas NIA. That is, the base insulating layer 210 overlaps the first areas IA and does not overlap the second areas NIA. The base insulating layer 210 includes first openings 211 in the second areas NIA formed by removing portions of the base insulating layer 210 from the second areas NIA. Each first opening 211 extends along the second direction DR2.

In an embodiment, the organic insulating layer 220 is disposed on the base insulating layer 210 in the first areas IA and the encapsulation layer 140 in the second areas NIA. The organic insulating layer 220 is commonly disposed in the first areas IA and the second areas NIA. The organic insulating layer 220 overlaps the first areas IA and the second areas NIA.

In an embodiment, the organic insulating layer 220 includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. The organic insulating layer 220 has a upper flat surface, i.e., a surface that is opposite to the encapsulation layer 140. That is, step-differences between the first and second areas IA and NIA caused by the first opening 211 of the base insulating layer 210 in the second areas NIA are removed or reduced by the organic insulating layer 220.

In an embodiment, the first conductive layer 230 is disposed on the organic insulating layer 220. For example, the first conductive layer 230 is disposed in the first areas IA when viewed in a plane, however, a position of the first conductive layer 230 is not particularly limited.

In an embodiment, the first conductive layer 230 may have a single-layer structure or a multi-layer structure of layers stacked in the third direction DR3. When the first conductive layer 230 has a single-layer structure, the first conductive layer 230 includes a metal layer or a transparent conductive layer. The metal layer includes at least one of molybdenum, silver, titanium, copper, aluminum, or alloys thereof. The transparent conductive layer includes a transparent conductive oxide, such as indium tin oxide (ITO), indium zinc oxide (IZO), zinc oxide (ZnO), or indium zinc tin oxide (IZTO). In addition, the transparent conductive layer may include a conductive polymer, such as PEDOT, a metal nanowire, or graphene.

In an embodiment, when the first conductive layer 230 has a multi-layer structure, the first conductive layer 230 includes a plurality of metal layers. For example, the metal layers have a three-layer structure of titanium/aluminum/titanium. The multi-layer first conductive layer 230 may include at least one metal layer and at least one transparent conductive layer.

In an embodiment, the inorganic insulating layer 240 is disposed on the first conductive layer 230 and the organic insulating layer 220. The first conductive layer 230 is covered by the inorganic insulating layer 240.

In an embodiment, the inorganic insulating layer 240 includes at least one of silicon nitride, silicon oxynitride, or silicon oxide. The inorganic insulating layer 240 may have a single-layer structure or a multi-layer structure of layers stacked in the third direction DR3.

In an embodiment, the inorganic insulating layer 240 is disposed in the first areas IA but is not disposed in the second areas NIA. That is, the inorganic insulating layer 240 overlaps the first areas IA and does not overlap the second areas NIA. The inorganic insulating layer 240 includes second openings 241 in the second areas NIA that are formed by removing the inorganic insulating layer 240 from the second areas NIA. Each second opening 241 extends along the second direction DR2. A width in the first direction DR1 of the first opening 211 may be substantially equal to that of the second opening 241, however, embodiments are not limited thereto. According to an embodiment, the width in the first direction DR1 of the second opening 241 is greater than the width of the first opening 211.

In an embodiment, the second conductive layer 250 is disposed on the inorganic insulating layer 240. For example, the second conductive layer 250 is disposed in the first areas IA and the second areas NIA. The second conductive layer 250 is disposed on the inorganic insulating layer 240 in the first areas IA, and the second conductive layer 250 is disposed on the organic insulating layer 220 exposed through the second opening 241 in the second areas NIA.

In an embodiment, the second conductive layer 250 may have a single-layer structure or a multi-layer structure of layers stacked in the third direction DR3. When the second conductive layer 250 has a single-layer structure, the second conductive layer 250 includes a metal layer or a transparent conductive layer. The metal layer includes at least one of molybdenum, silver, titanium, copper, aluminum, or alloys thereof. The transparent conductive layer includes a transparent conductive oxide, such as indium tin oxide (ITO), indium zinc oxide (IZO), zinc oxide (ZnO), or indium zinc tin oxide (IZTO). In addition, the transparent conductive layer may include a conductive polymer, such as PEDOT, a metal nanowire, or graphene.

In an embodiment, when the second conductive layer 250 has a multi-layer structure, the second conductive layer 250 includes a plurality of metal layers. For example, the metal layers may have a three-layer structure of titanium/aluminum/titanium. The multi-layer second conductive layer 250 may include at least one metal layer and at least one transparent conductive layer.

In an embodiment, the cover insulating layer 260 is disposed on the second conductive layer 250. The cover insulating layer 260 includes an organic layer. The organic layer includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. The cover insulating layer 260 protects the first and second conductive layers 230 and 250 from foreign substances such as dust particles.

For example, in an embodiment, the bridge portion BP is included in the first conductive layer 230, and the first sensing portions SP1, the second sensing portions SP2, and the extension portion EP are included in the second conductive layer 250.

Referring to FIG. 7B, in an embodiment, an inorganic insulating layer 240a includes second openings 241a in the second areas NIA that are formed by removing portions of the inorganic insulating layer 240a. Each second opening 241a extends along the second direction DR2. The second opening 241a of the inorganic insulating layer 240a includes a side surface 242. The side surface 242 is an inclined surface that is inclined at a first angle $\theta 1$ with respect to an upper surface 221 of the organic insulating layer 220. For example, the first angle $\theta 1$ is less than about 90°.

In an embodiment, when the side surface 242 is inclined, a thickness of the inorganic insulating layer 240a decreases with decreasing distance from the second opening 241a. In addition, as the first angle $\theta 1$ decreases, the side surface 242 becomes more gentle. The inclined side surface 242 reduces the step difference between the inorganic insulating layer 240a and an organic insulating layer 220. Accordingly, a second conductive layer 250 can be prevented from disconnecting due to the step difference in a boundary between adjacent first and second areas IA and NIA.

In an embodiment, a slope of the side surface 242 of the inorganic insulating layer 240a is not limited to an inclined surface. For example, the side surface 242 can have a stepped shape that includes a plurality of steps whose magnitude is less that the step difference between the inorganic insulating layer 240a and an organic insulating layer 220. When the side surface 242 has a stepped shape, a step difference between the inorganic insulating layer 240a and the organic insulating layer 220 is reduced.

Referring to FIG. 7C, in an embodiment, an encapsulation layer 140a includes a first inorganic layer 141a, an organic layer 142a, and a second inorganic layer 143a that are sequentially stacked on each other.

In an embodiment, the first inorganic layer 141a is disposed in the first areas IA but not in the second areas NIA. That is, the first inorganic layer 141a overlaps the first areas IA but does not overlap the second areas NIA. The first inorganic layer 141a includes third openings 141a_OP in the second areas NIA that are formed by removing portions of the first inorganic layer 141a. Each third opening 141a_OP extends along the second direction DR2.

In an embodiment, the organic layer 142a is disposed on the first inorganic layer 141a and the light emitting element layer 130. The organic layer 142a is commonly disposed in the first areas IA and the second areas NIA. The organic layer 142a may overlap the first areas IA and the second areas NIA. The organic layer 142a is disposed on the first inorganic layer 141a in the first area IA and on the light emitting element layer 130 in the second area NIA. The organic layer 142a has a flat upper surface. That is, a step difference generated between the first and second areas IA and NIA due to the third opening 141a_OP in the first inorganic layer 141a in the second areas NIA can be eliminated or reduced by the organic layer 142a.

In an embodiment, the second inorganic layer 143a is disposed on the organic layer 142a. The second inorganic layer 143a is disposed in the first areas IA but not in the second areas NIA. That is, the second inorganic layer 143a overlaps the first areas IA but does not overlap the second areas NIA. The second inorganic layer 143a includes fourth openings 143a_OP in the second areas NIA that are formed by removing portions of the second inorganic layer 143a. Each fourth opening 143a_OP extend along the second direction DR2.

In an embodiment, the base insulating layer 210 is disposed on the second inorganic layer 143a. The first opening 211 of the base insulating layer 210 corresponds to the fourth opening 143a_OP of the second inorganic layer 143a. A width in the first direction DR1 of the third opening 141a_OP is substantially the same as a width of the first and second openings 211 and 241, and a width in the first direction DR1 of the fourth opening 143a_OP is substantially the same as the width of the first and second openings 211 and 241, however, embodiments are not limited thereto.

For example, the width in the first direction DR1 of the fourth opening 143a_OP may be less than the width of the first opening 211, and the width in the first direction DR1 of the third opening 141a_OP may be smaller than the width of the fourth opening 143a_OP.

FIGS. 7A and 7C show a structure in which the base insulating layer 210 is disposed between the organic insulating layer 220 and the encapsulation layer 140, however, embodiments of the present disclosure are not limited thereto. That is, in other embodiments, the base insulating layer 210 can be omitted. When the base insulating layer 210 is omitted, the organic insulating layer 220 is disposed directly on the encapsulation layer 140.

FIG. 7C shows a structure in which portions of some components of the encapsulation layer 140a, i.e., the first and second inorganic layers 141a and 143a are removed from the second areas NIA, however, embodiments of the present disclosure are not limited thereto. For example, only one of the first and second inorganic layers 141a and 143a is removed from the second areas NIA. In addition, in some embodiments, another insulating layer of the display panel 100 other than the encapsulation layer 140a, such as the buffer layer BFL or at least one of the insulating layers 10 to 50 of the circuit layer 120, can be removed from the second areas NIA.

As described above, according to embodiments, as the first and second areas IA and NIA are alternately arranged with each other in the rolling direction, stress applied to the display panel DP and the input sensor 200 can be relieved when the display device DD is rolled in the rolling direction. In particular, when being rolled, layers that include an inorganic material are subject to more stress than layers that include an organic material. Accordingly, at least one of the layers that include an inorganic material, such as the inorganic insulating layer 240, the base insulating layer 210, or the first and second inorganic layers 141a and 143a, are repeatedly removed along the rolling direction, and thus, stress applied to the inorganic layers can be relieved. Thus, rolling characteristics and reliability of the display device DD can be improved.

Figure 8:
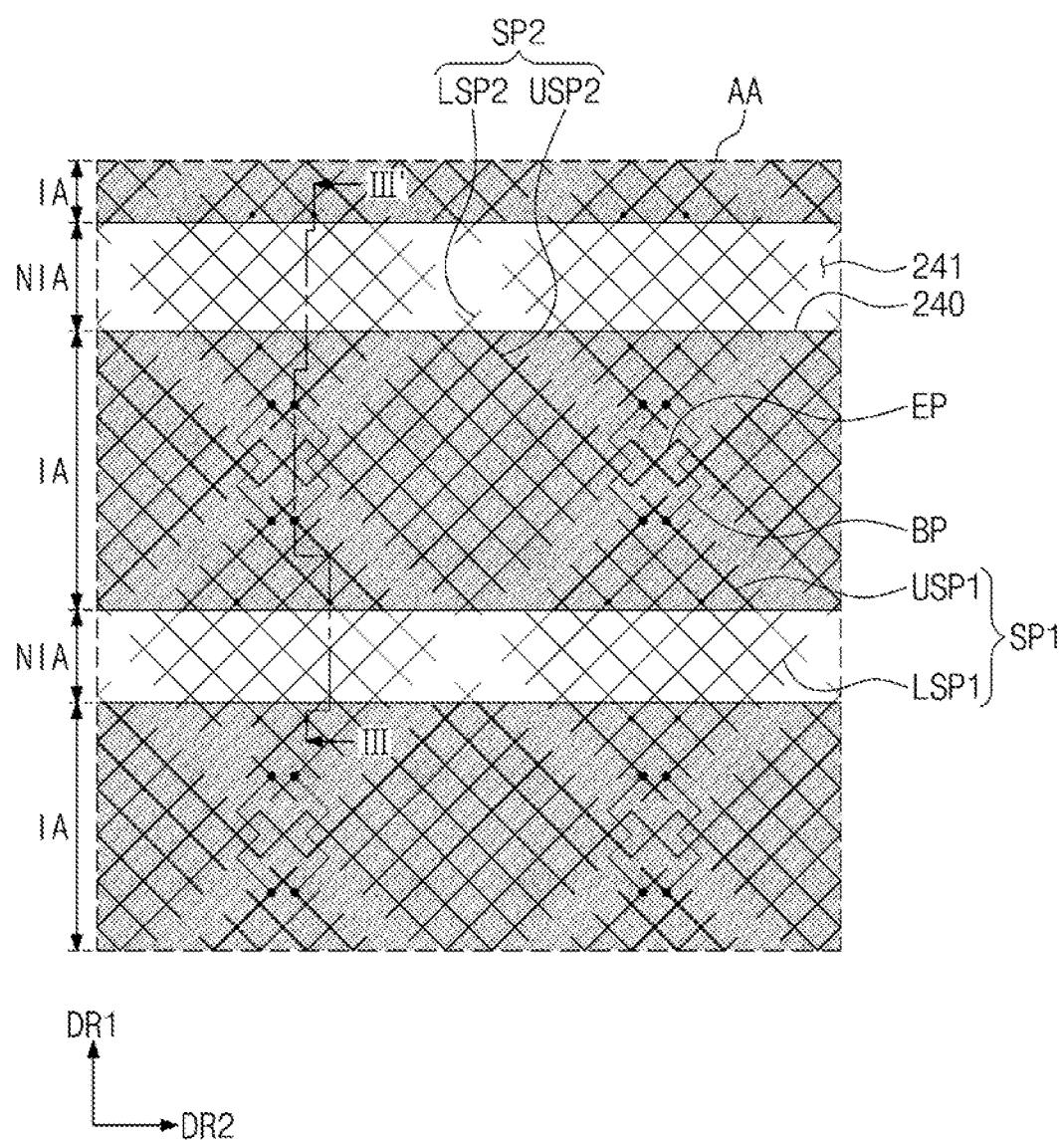
FIG. 8 is a plan view of portion AA in FIG. 5 according to an embodiment of the present disclosure.
Figure 9:
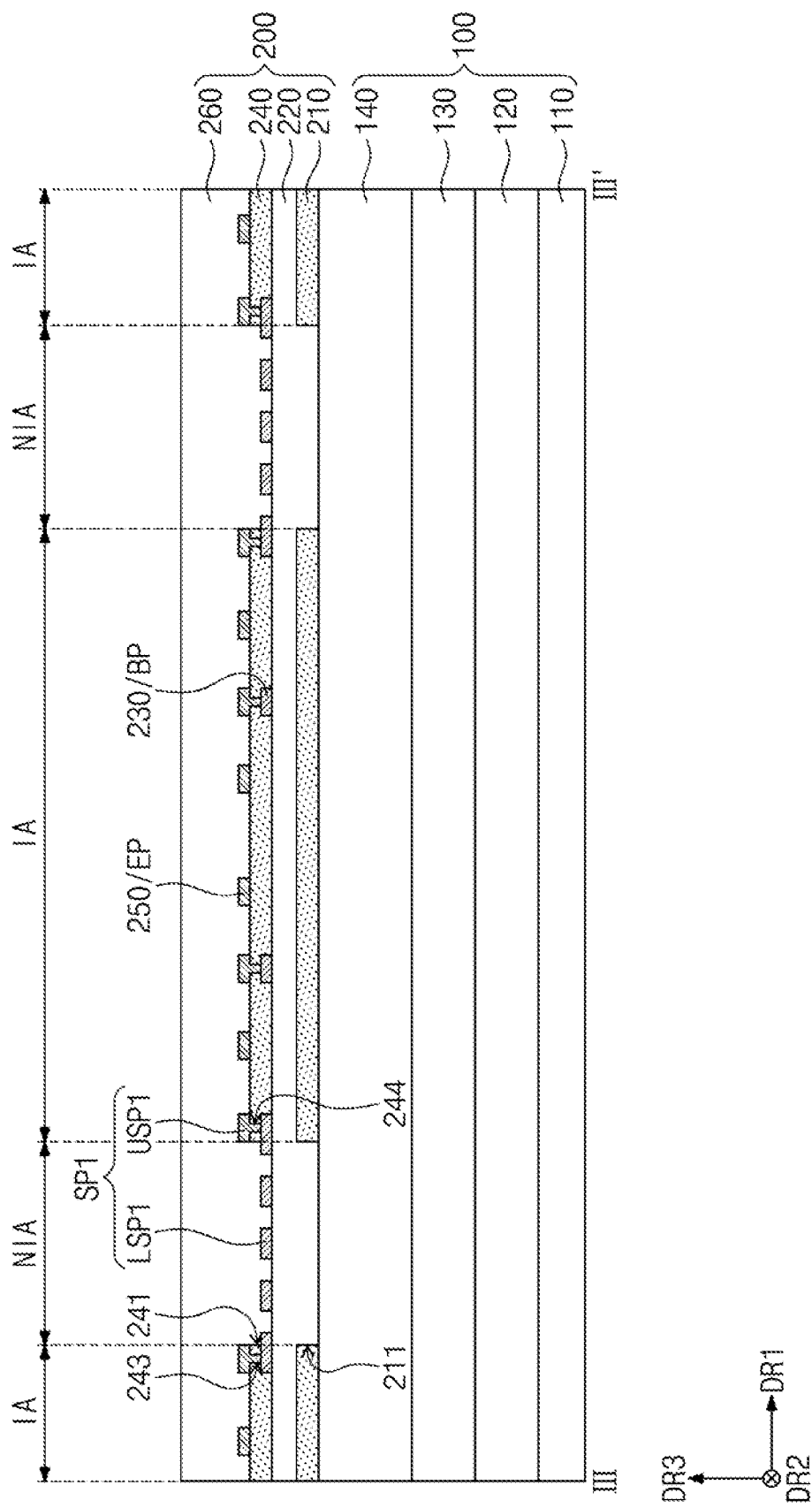
FIG. 9 is a cross-sectional view taken along line III-III' in FIG. 8.

FIG. 8 is a plan view of portion AA in FIG. 5 according to an embodiment of the present disclosure, and FIG. 9 is a cross-sectional view taken along line in FIG. 8.

Referring to FIGS. 8 and 9, in an embodiment, at least one of the first sensing portions SP1 includes a first upper sensing portion USP1 disposed in the first areas IA and a first lower sensing portion LSP1 disposed in the second areas NIA. A first sensing portion SP1 that is commonly disposed over the first and second areas IA and NIA includes the first lower sensing portion LSP1 formed from the first conductive layer 230 and the first upper sensing portion USP1 formed from the second conductive layer 250. However, a first sensing portion SP1 that overlaps the first areas IA but not the second areas NIA is included in the second conductive layer 250.

In an embodiment, each of the first lower sensing portion LSP1 and the first upper sensing portion USP1 has a mesh shape. The first lower sensing portion LSP1 extends in the first areas IA and the second areas IA and partially overlaps the first upper sensing portion USP1. The inorganic insulating layer 240 includes a first inorganic contact hole 243 through which a first extension end of the first lower sensing portion LSP1 is exposed and a second inorganic contact hole 244 through which a second extension end opposite to the first extension end is exposed.

In an embodiment, the first extension end of the first lower sensing portion LSP1 is directly connected to a first upper sensing portion USP1 via the first inorganic contact hole 243, and the second extension end of the first lower sensing portion LSP1 is directly connected to another first upper sensing portion USPlvia the second inorganic contact hole 244. Accordingly, the first lower sensing portion LSP1 is electrically connected to the first upper sensing portion USP1.

In an embodiment, at least one of the second sensing portions SP2 includes a second upper sensing portion USP2 disposed in the first areas IA and a second lower sensing portion LSP2 disposed in the second areas NIA. When at least one of the second sensing portions SP2 overlaps the first and second areas IA and NIA, the at least one second sensing portion SP2 includes the second lower sensing portion LSP2 formed from the first conductive layer 230 and the second upper sensing portion USP2 formed from the second conductive layer 250. However, when at least one of the second sensing portions SP2 overlaps the first areas IA but not the second areas NIA, the at least one second sensing portion SP2 is included in the second conductive layer 250.

In an embodiment, since the connection structure between the second lower sensing portion LSP2 and the second upper sensing portion USP2 is similar to the connection structure between the first lower sensing portion LSP1 and the first upper sensing portion US P1, detailed descriptions thereof will be omitted.

In an embodiment, the sensing portions SP1 or SP2 that commonly overlap the first and second areas IA and NIA are disposed after being divided into the lower sensing portion LSP1 or LSP2 and the upper sensing portion USP1 or USP2. Accordingly, defects such as disconnections generated at the boundary between the first and second areas IA and NIA due to the step difference between the organic insulating layer 220 and the inorganic insulating layer 240 can be removed or reduced.

Figure 10:
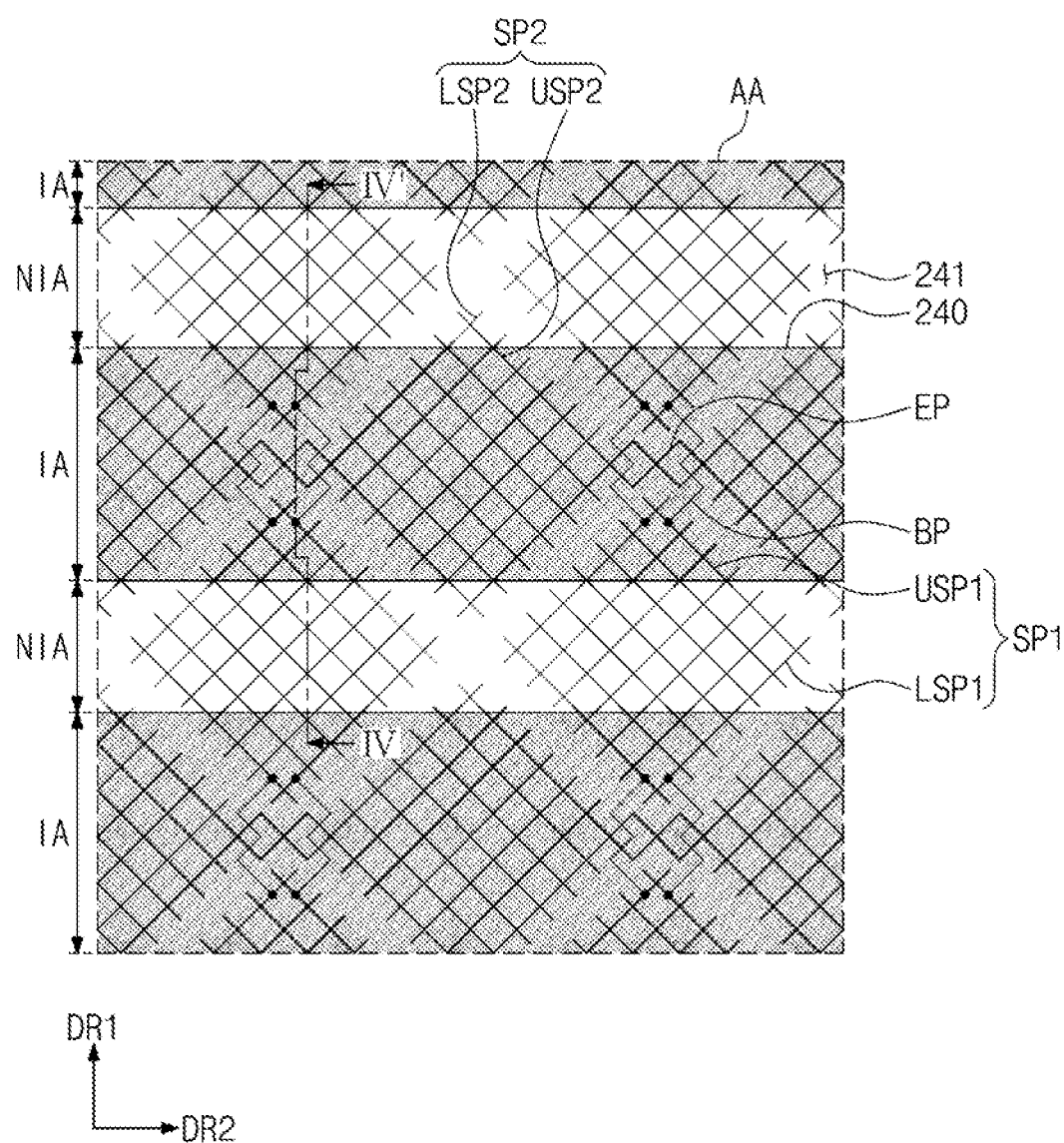
FIG. 10 is a plan view of portion AA in FIG. 5 according to an embodiment of the present disclosure.
Figure 11:
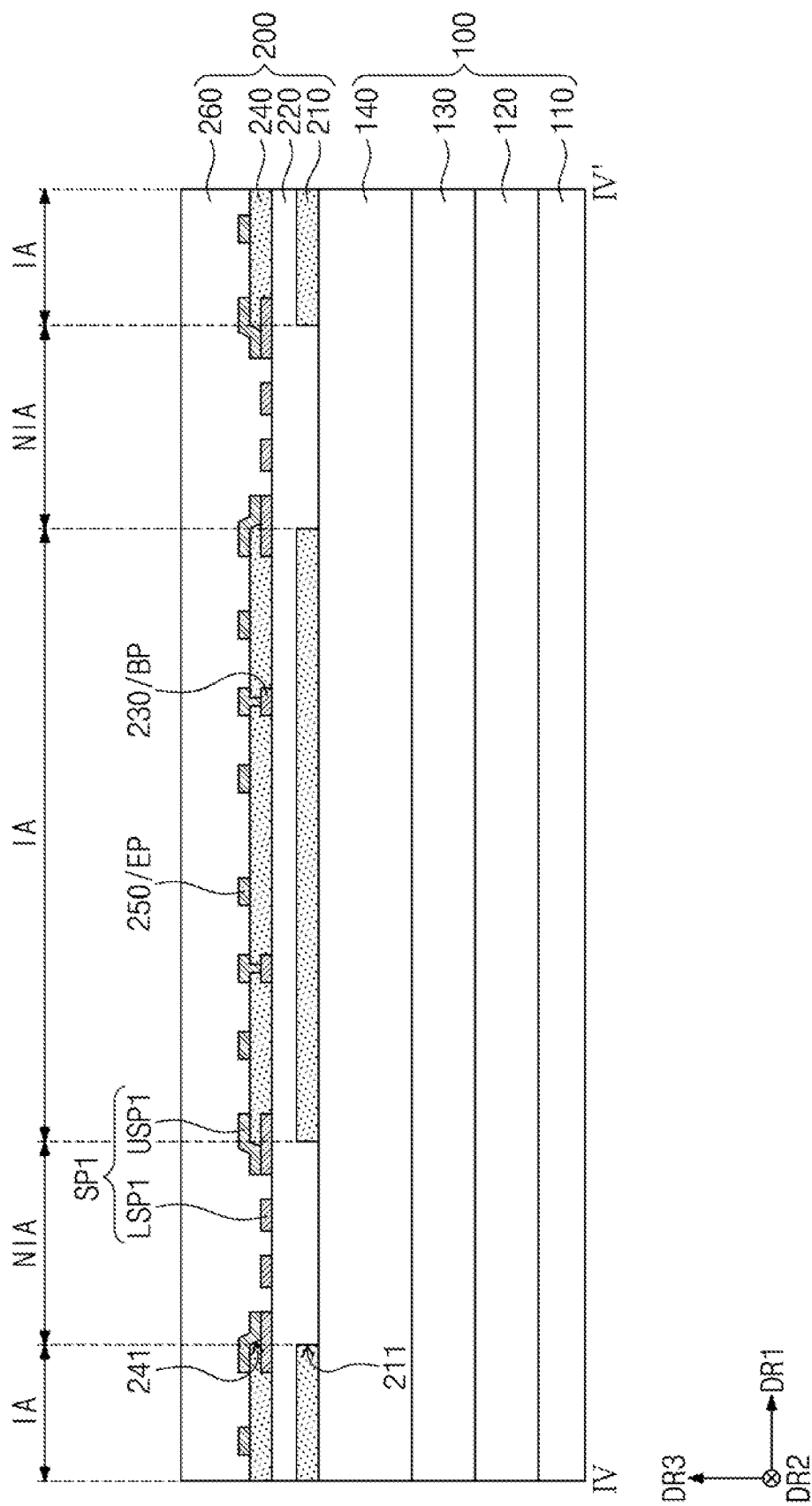
FIG. 11 is a cross-sectional view taken along line IV-IV' in FIG. 10.

FIG. 10 is a plan view of portion AA in FIG. 5 according to an embodiment of the present disclosure, and FIG. 11 is a cross-sectional view taken along line IV-IV' in FIG. 10.

Referring to FIGS. 10 and 11, in an embodiment, at least one of the first sensing portions SP1 includes a first upper sensing portion USP1 disposed in first areas IA and a first lower sensing portion LSP1 disposed in second areas NIA. When at least one of the first sensing portions SP1 overlaps the first and second areas IA and NIA, the at least one first sensing portion SP1 includes the first lower sensing portion LSP1 in the first conductive layer 230 and the first upper sensing portion USP1 in the second conductive layer 250. However, when at least one of the first sensing portions SP1 overlaps the first areas IA but not the second areas NIA, the at least one first sensing portion SP1 is included in the second conductive layer 250.

In an embodiment, each of the first lower sensing portion LSP1 and the first upper sensing portion USP1 have a mesh shape. The first upper sensing portion USP1 extends from the first areas IA into the second areas NIA and partially overlaps the first lower sensing portion LSP1. In the second areas NIA, the first lower sensing portion LSP1 are exposed via the first opening 241 in the inorganic insulating layer 240. The first upper sensing portion USP1 that extends into the second areas NIA is directly connected to the first lower sensing portion LSP1 in the first opening 241.

In an embodiment, at least one of second sensing portions SP2 includes a second upper sensing portion USP2 disposed in the first areas IA and a second lower sensing portion LSP2 disposed in the second areas NIA. When at least one of the second sensing portions SP2 overlaps the first and second areas IA and NIA, the at least one second sensing portion SP2 includes the second lower sensing portion LSP2 in the first conductive layer 230 and the second upper sensing portion USP2 in the second conductive layer 250. However, when at least one of the second sensing portions SP2 overlaps the first areas IA but not the second areas NIA, the at least one second sensing portion SP2 is included in the second conductive layer 250.

In an embodiment, since the connection structure between the second lower sensing portion LSP2 and the second upper sensing portion USP2 is similar to the connection structure between the first lower sensing portion LSP1 and the first upper sensing portion USP1, detailed descriptions thereof will be omitted.

In an embodiment, since the lower sensing portion LSP1 or LSP2 is disposed in the second areas NIA, a depth of the first opening 241 in the inorganic insulating layer 240 can be partially reduced. The lower sensing portion LSP1 or LSP2 are directly connected to the upper sensing portion USP1 or USP2 where the depth of the first opening 241 is reduced. Due to the depth reduction of the first opening 241, the connection reliability between the lower sensing portion LSP1 or LSP2 and the upper sensing portion USP1 or USP2 can be increased.

Figure 12:
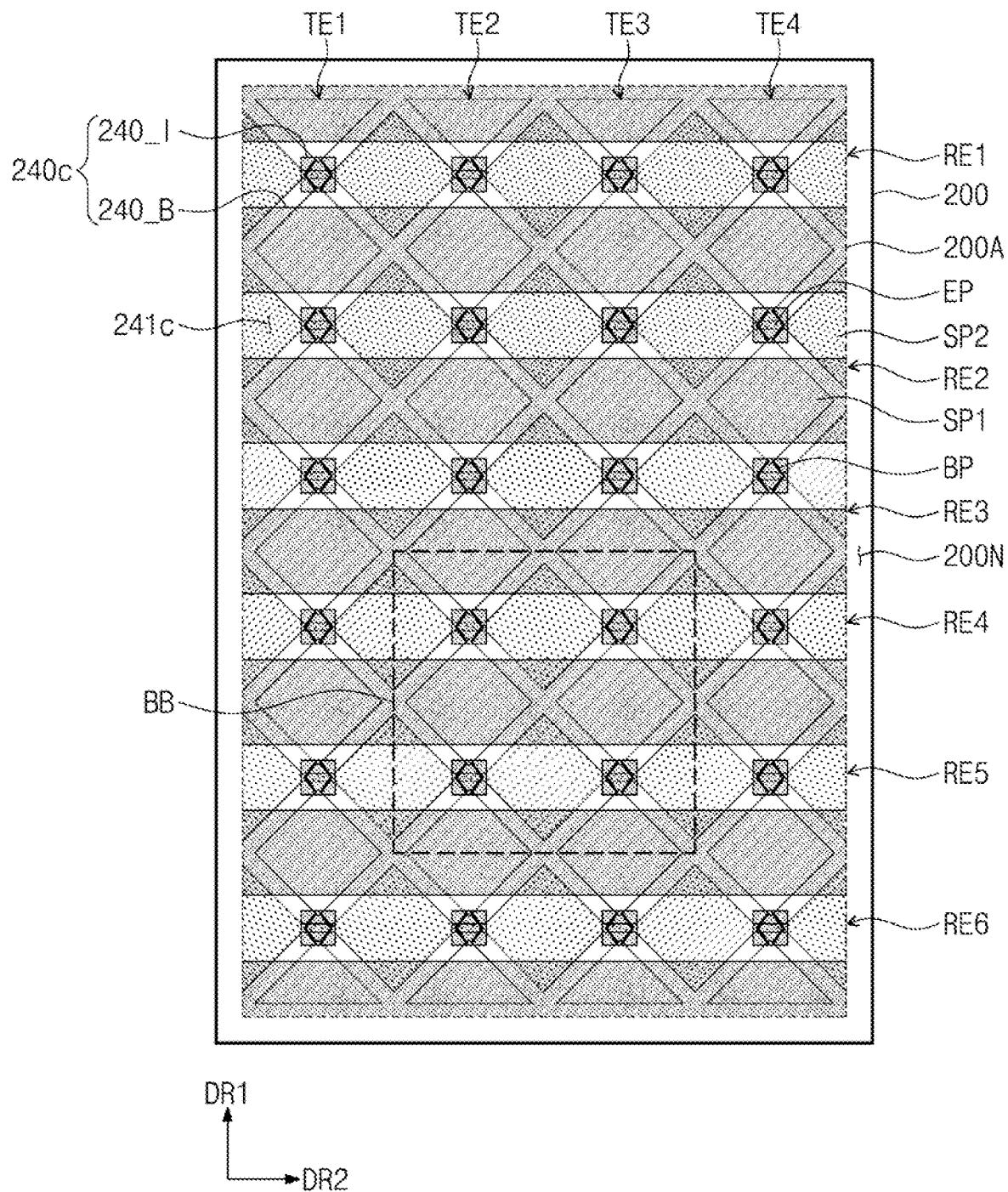
FIG. 12 is a plan view of an input sensor according to an embodiment of the present disclosure.
Figure 13:
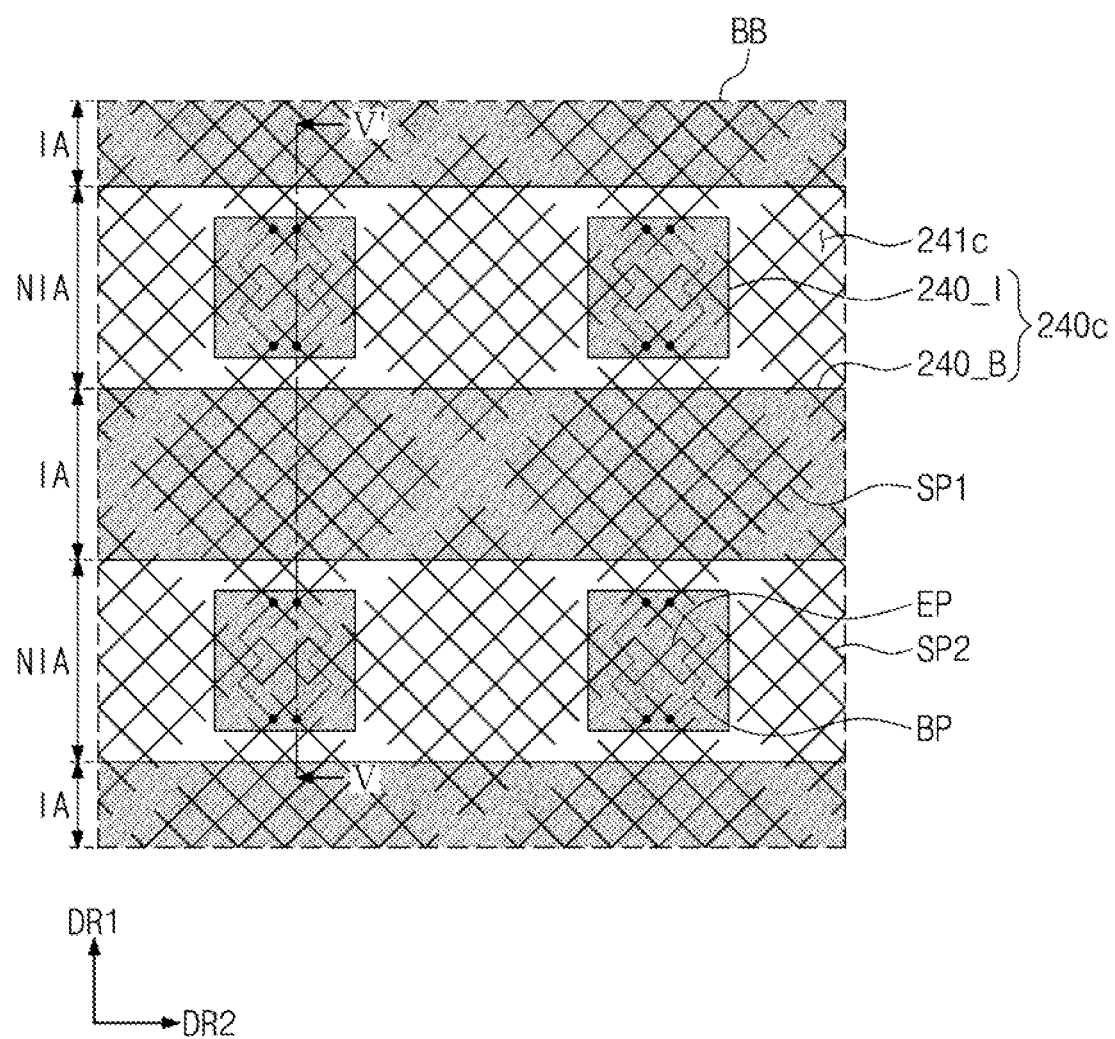
FIG. 13 is an enlarged plan view of portion BB in FIG. 12 according to an embodiment of the present disclosure.
Figure 14:
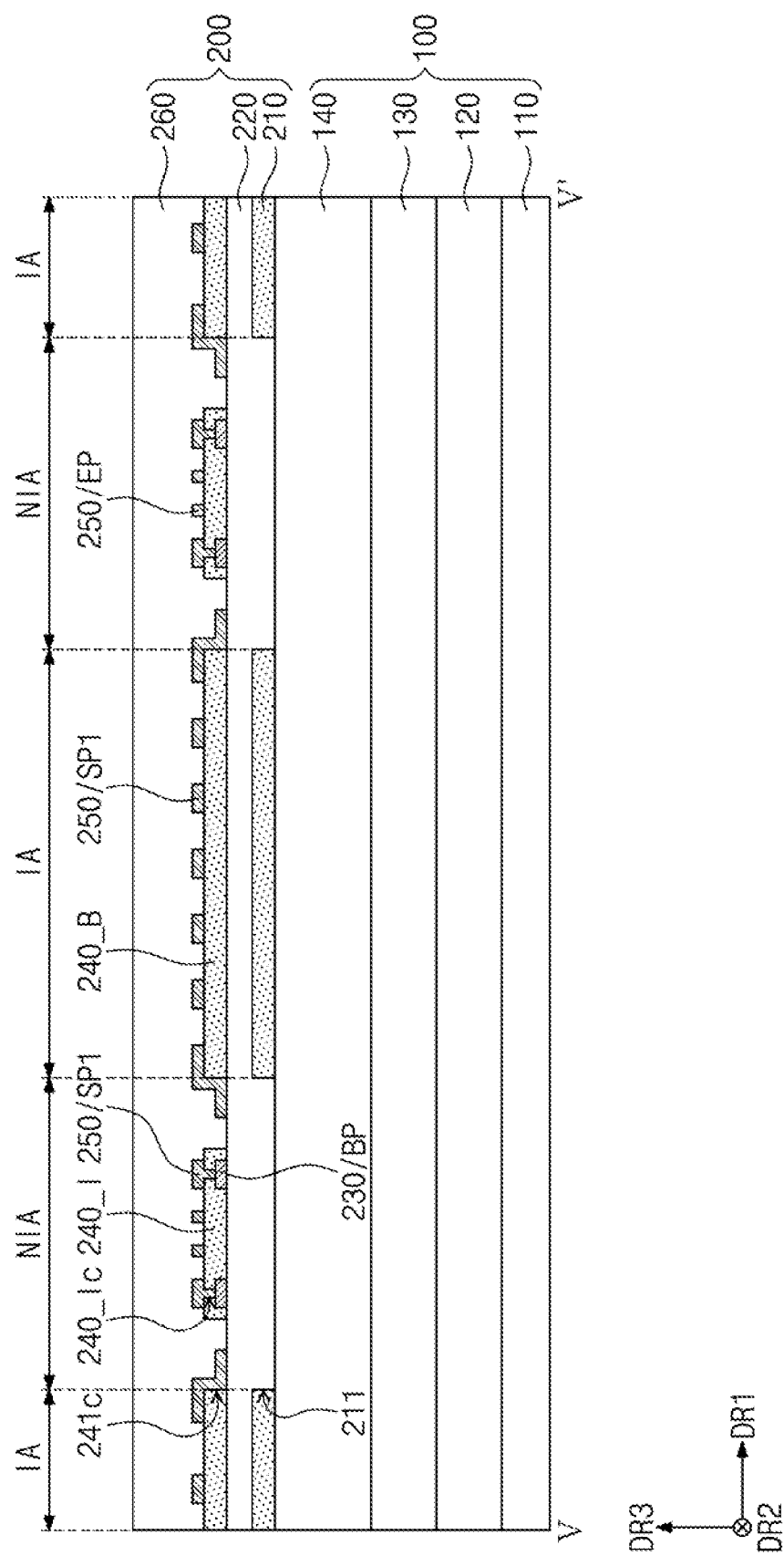
FIG. 14 is a cross-sectional view taken along line V-V' in FIG. 13.
Figure 15:
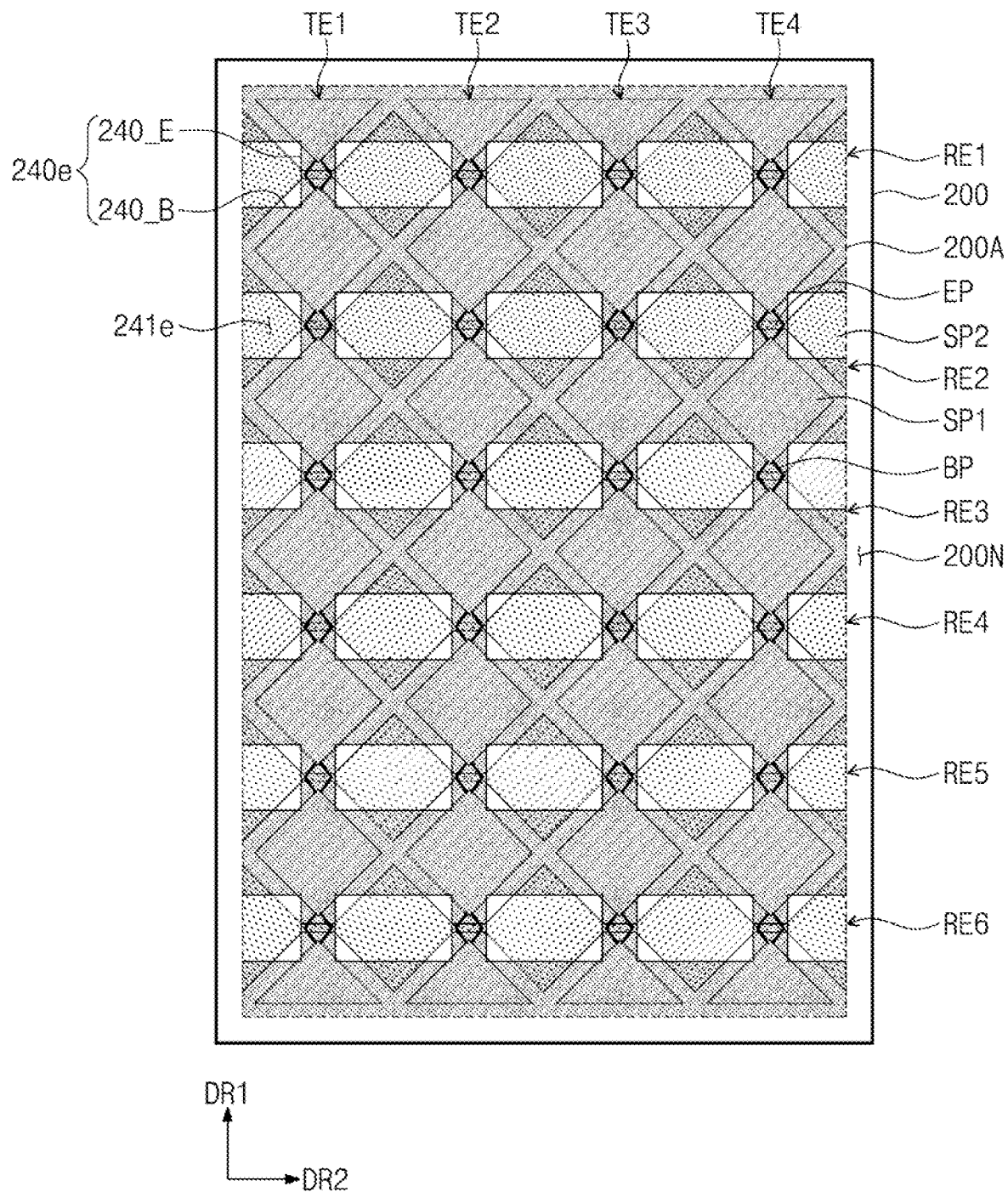
FIGS. 15 and 16 are plan views of input sensors according to embodiments of the present disclosure.

FIG. 12 is a plan view of an input sensor according to an embodiment of the present disclosure, FIG. 13 is an enlarged plan view of portion BB in FIG. 12 according to an embodiment of the present disclosure, and FIG. 14 is a cross-sectional view taken along line V-V' in FIG. 13. FIG. 15 is a plan view of an input sensor according to an embodiment of the present disclosure. In FIGS. 12 to 15, the same reference numerals denote the same elements in FIGS. 5 to 11, and thus, detailed descriptions thereof will be omitted.

Referring to FIGS. 12 and 13, in an embodiment, the input sensor 200 includes a sensing area 200A and a non-sensing area 200N. The sensing area 200A includes a plurality of first areas IA and a plurality of second areas NIA. The first areas IA are repeatedly arranged in the first direction DR1, and the second areas NIA are repeatedly arranged in the first direction DR1. For example, the first areas IA are alternately arranged in the first direction DR1 with the second areas NIA.

In an embodiment, an inorganic insulating layer 240c includes a plurality of first inorganic insulating layers 240_B disposed in the first areas IA and a plurality of second inorganic insulating layers 240_I disposed in the second areas NIA. The inorganic insulating layer 240c includes first opening areas 241c in the second areas NIA that are formed by removing portions of the first and second inorganic insulating layers 240_B and 240_I. Each of the first inorganic insulating layers 240_B has a bar shape that extends in the second direction DR2, and each of the second inorganic insulating layers 240_I has an island shape.

In an embodiment, the input sensor 200 includes a plurality of first sensing electrodes TE1 to TE4 and a plurality of second sensing electrodes RE1 to RE6. The first sensing electrodes TE1 to TE4 extend in the first direction DR1 and are arranged in the second direction DR2. The second sensing electrodes RE1 to RE6 extend in the second direction DR2 and are arranged in the first direction DR1.

In an embodiment, each of the first sensing electrodes TE1 to TE4 includes a plurality of first sensing portions SP1 and a bridge portion BP. Two adjacent first sensing portions SP1 are electrically connected to each other by the bridge portion BP, however, embodiments are not limited thereto. The first sensing portions SP1 and the bridge portion BP are disposed on different layers from each other.

In an embodiment, each of the second sensing electrodes RE1 to RE6 includes a plurality of second sensing portions SP2 and an extension portion EP. The second sensing portions SP2 are integrally provided with the extension portion EP and are disposed on the same layer as the extension portion EP. The bridge portion BP and the extension portion EP are disposed at crossing portions of the first and second sensing electrodes TE1 to TE4 and RE1 to RE6, and the bridge portion BP is insulated from the extension portion EP by the second inorganic insulating layer 240_I while crossing the extension portion EP at the crossing portions.

Referring to FIGS. 13 and 14, in an embodiment, the input sensor 200 is disposed on a display panel 100. The input sensor 200 is disposed directly on an encapsulation layer 140.

In an embodiment, the input sensor 200 includes a base insulating layer 210, an organic insulating layer 220, a first conductive layer 230, an inorganic insulating layer 240c, a second conductive layer 250, and a protective insulating layer 260.

In an embodiment, the base insulating layer 210 is disposed in the first areas IA but is not disposed in the second areas NIA. That is, the base insulating layer 210 overlaps the first areas IA but does not overlap the second areas NIA. The base insulating layer 210 includes first openings 211 in the second areas NIA that are formed by removing portions of the base insulating layer 210 from the second areas NIA.

In an embodiment, the organic insulating layer 220 is disposed on the base insulating layer 210 and the encapsulation layer 140. The organic insulating layer 220 is commonly disposed over the first areas IA and the second areas NIA. The organic insulating layer 220 overlaps the first areas IA and the second areas NIA. The organic insulating layer 220 is disposed on the base insulating layer 210 in the first areas IA and on the encapsulation layer 140 in the second areas NIA.

In an embodiment, the inorganic insulating layer 240c includes the first inorganic insulating layers 240_B and the second inorganic insulating layers 240_I. The first inorganic insulating layers 240_B are disposed in the first areas IA, and each of the first inorganic insulating layers 240_B has a bar shape that extends in the second direction DR2. The second inorganic insulating layers 240_I are disposed in the second areas NIA, and each of the second inorganic insulating layers 240_I has a square dot shape.

In an embodiment, the inorganic insulating layer 240c includes first opening areas 241c in the second areas NIA in which the first and second inorganic insulating layers 240_B and 240_I are not disposed.

In an embodiment, the first conductive layer 230 is disposed on the organic insulating layer 220. The first conductive layer 230 is covered by the second inorganic insulating layer 240_I in the second areas NIA. The bridge portion BP of the first sensing electrodes TE1 to TE4 is included in the first conductive layer 230.

In an embodiment, the second conductive layer 250 is disposed on the first and second inorganic insulating layers 240_B and 240_I. The first sensing portions SP1 of the first sensing electrodes TE1 to TE4 and the second sensing portions SP2 and the extension portion EP of the second sensing electrodes RE1 to RE6 are included in the second conductive layer 250. The second inorganic insulating layer 240_I includes a contact hole 240_Ic that penetrates therethrough and exposes the bridge portion BP. Accordingly, the first sensing portions SP1 are directly connected to the bridge portion BP via the contact hole 240_Ic in the second inorganic insulating layer 240_I.

In an embodiment, although the bridge portion BP and the extension portion EP are disposed in the second areas NIA, the second inorganic insulating layer 240_I is disposed between the bridge portion BP and the extension portion EP in the second areas NIA. Accordingly, the bridge portion BP and the extension portion EP are electrically insulated from each other by the second inorganic insulating layer 240_I.

FIGS. 12 to 14 show a structure in which the first inorganic insulating layer 240_B and the second inorganic insulating layer 240_I are spaced apart from each other, however, embodiments of the present disclosure are not limited thereto.

As shown in FIG. 15, in an embodiment, an inorganic insulating layer 240e includes a plurality of first inorganic insulating layers 240_B disposed in the first areas IA and a plurality of second inorganic insulating layers 240_E disposed in the second areas NIA. The second inorganic insulating layers 240_E extend in the first direction from the first inorganic insulating layers 240_B. That is, the first and second inorganic insulating layers 240_B and 240_E are integrally formed with each other. However, the inorganic insulating layer 240e includes second opening areas 241e in the second areas NIA that are formed by removing portions of the first and second inorganic insulating layers 240_B and 240_E from the second areas NIA.

In an embodiment, the second opening areas 241e are spaced apart from each other in the second direction DR2 by the second inorganic insulating layer 240_E and are spaced apart from each other in the first direction DR1 by the first inorganic insulating layer 240_B.

As described above, when the crossing portions of the first and second sensing electrodes TE1 to TE4 and RE1 to RE6 are disposed in the second areas NIA, the inorganic insulating layer that corresponds to the crossing area partially remains in the second areas NIA. Accordingly, the connection structure between the bridge portion BP and the first sensing portions SP1 and the electrical insulating structure between the bridge portion BP and the extension portion EP are provided in the second areas NIA.

Figure 16:
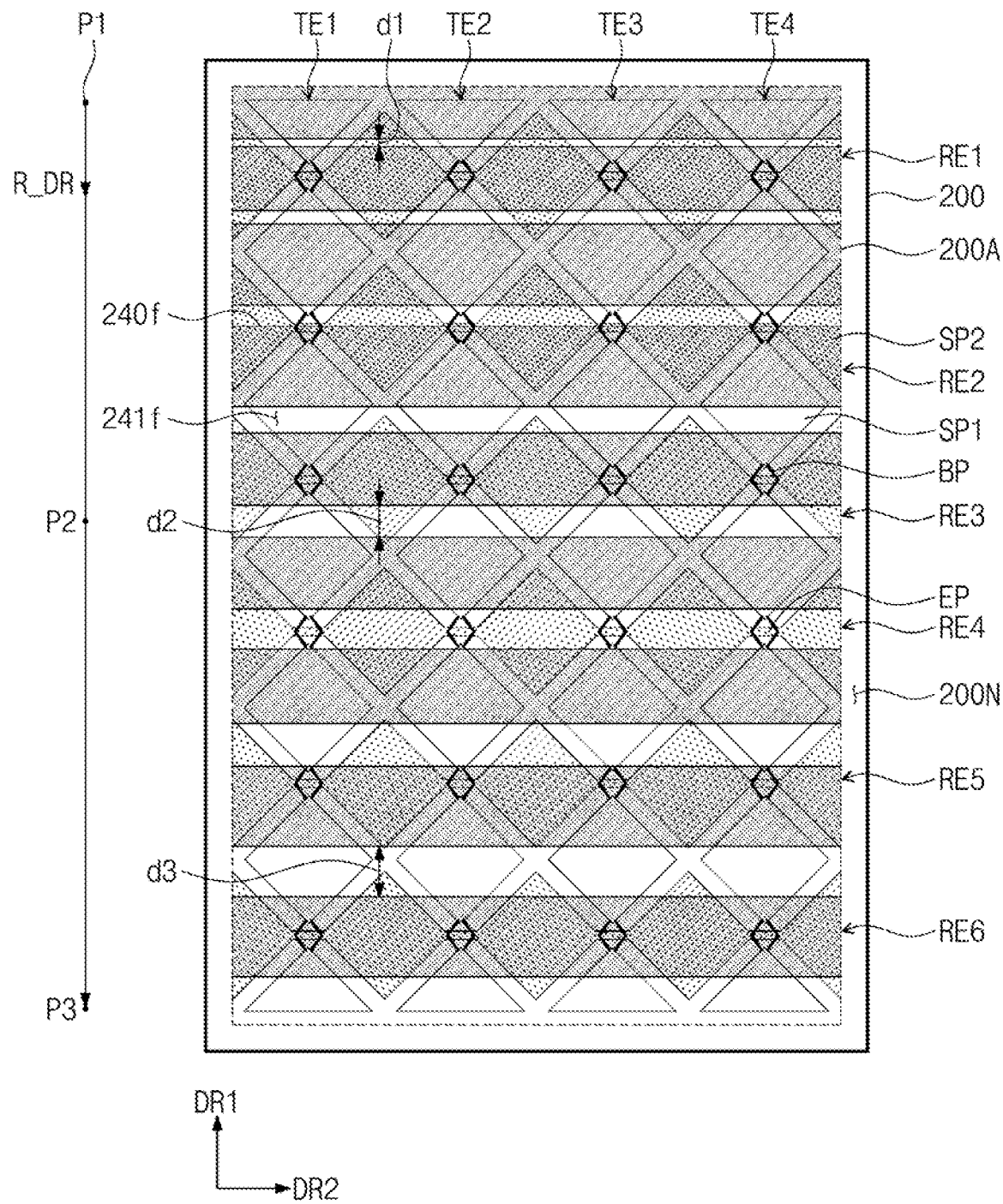

FIG. 16 is a plan view of an input sensor according to an embodiment of the present disclosure.

Referring to FIG. 16, in an embodiment, a plurality of inorganic insulating layers 240f are disposed in the sensing area 200A. An organic insulating layer 220 (refer to FIG. 14) is disposed on the plurality of inorganic insulating layers 240f and the first and second sensing electrodes TE1 to TE4 and RE1 to RE6 are disposed on the organic insulating layer 220. The inorganic insulating layers 240f are repeatedly arranged in a rolling direction R_DR, and the inorganic insulating layers 240f are spaced apart from each other in the rolling direction R_DR by a plurality of second openings 241f. That is, the inorganic insulating layers 240f are alternately arranged in the rolling direction R_DR with the second openings 241f. The rolling direction corresponds to the first direction DR1, and the inorganic insulating layers 240f and the second openings 241f each extend in the second direction that crosses the first direction.

In the second openings 241f have widths in the rolling direction R_DR parallel to the first direction DR1 that differ from each other. Let a point at which the rolling starts in the display device DD be referred to as a first point P1, and a point at which the rolling is finished be referred to as a third point P3. Then, the width of each of the second openings 241f increases going from the first point P1 to the third point P3.

In an embodiment, the second opening 241f adjacent to the first point P1 has a first width d1 in the rolling direction R_DR, and the second opening 241f adjacent to an intermediate point between the first point P1 and the third point P3, i.e., a second point P2, has a second width d2 in the rolling direction R_DR that is greater than the first width d1. In addition, the second opening 241f adjacent to the third point P3 has a third width d3 in the rolling direction R_DR that is greater than the second width d2.

FIG. 16 shows a structure in which the width of each of the second openings 241f increases going from the first point P1 to the third point P3, however, embodiments of the present disclosure are not limited thereto. According to an embodiment, the input sensor 200 can be divided into a plurality of parts in the rolling direction R_DR, and the width of the second openings 241f can differ in each part.

Figure 17:
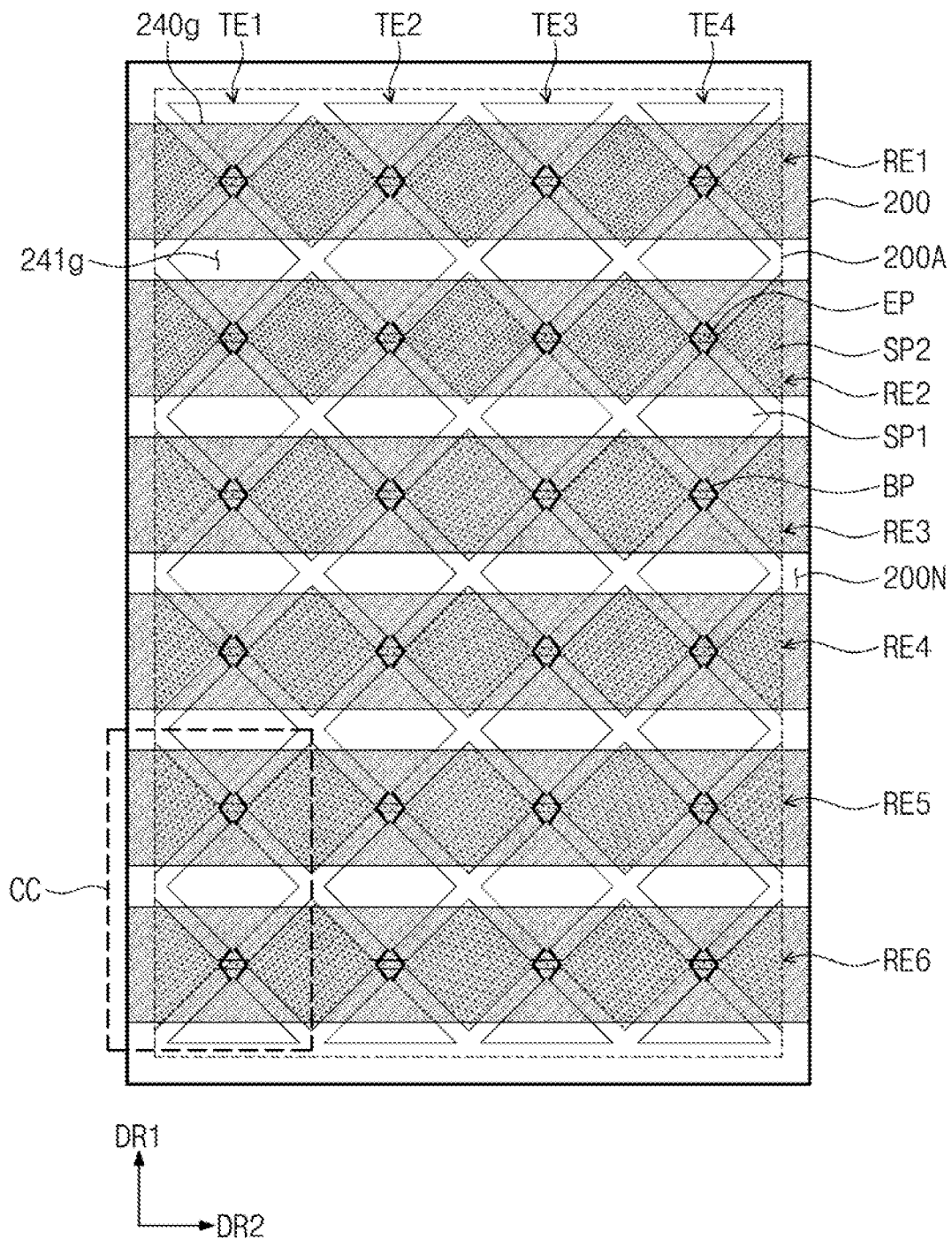
FIG. 17 is a plan view of an input sensor according to an embodiment of the present disclosure.
Figure 18:
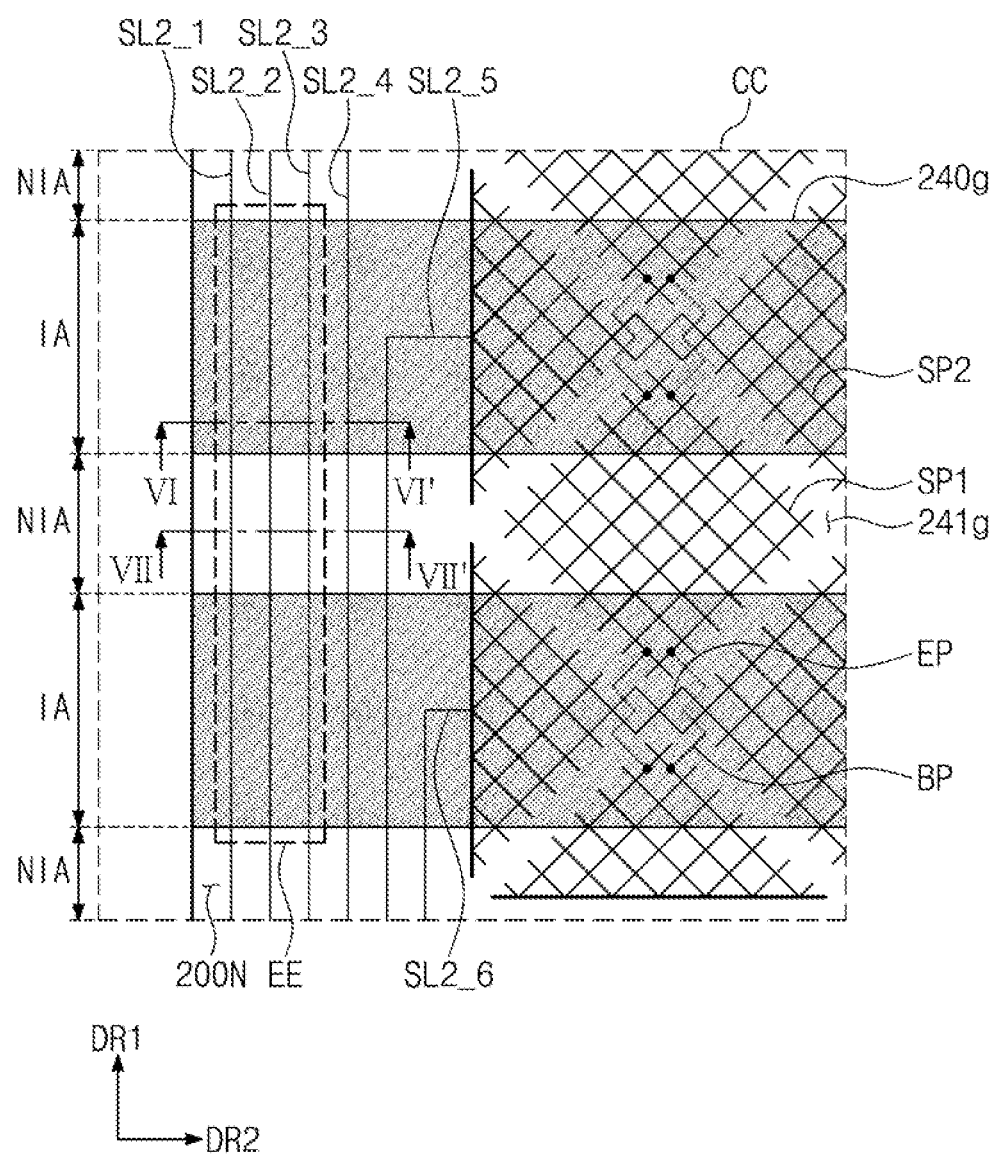
FIG. 18 is an enlarged plan view of portion CC in FIG. 17 according to an embodiment of the present disclosure.
Figure 19A:
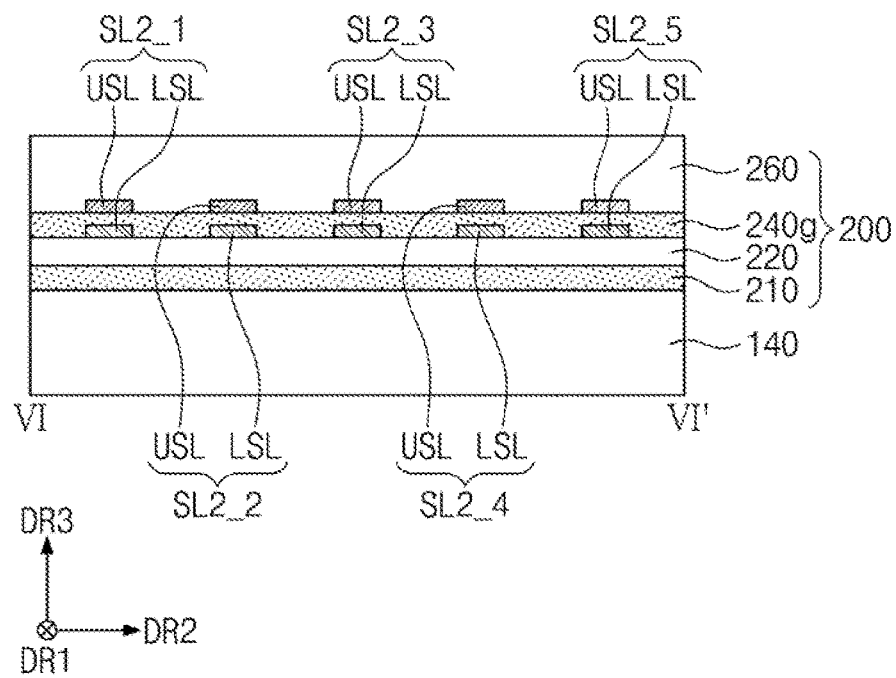
FIG. 19A is a cross-sectional view taken along line VI-VI' in FIG. 18.
Figure 19B:
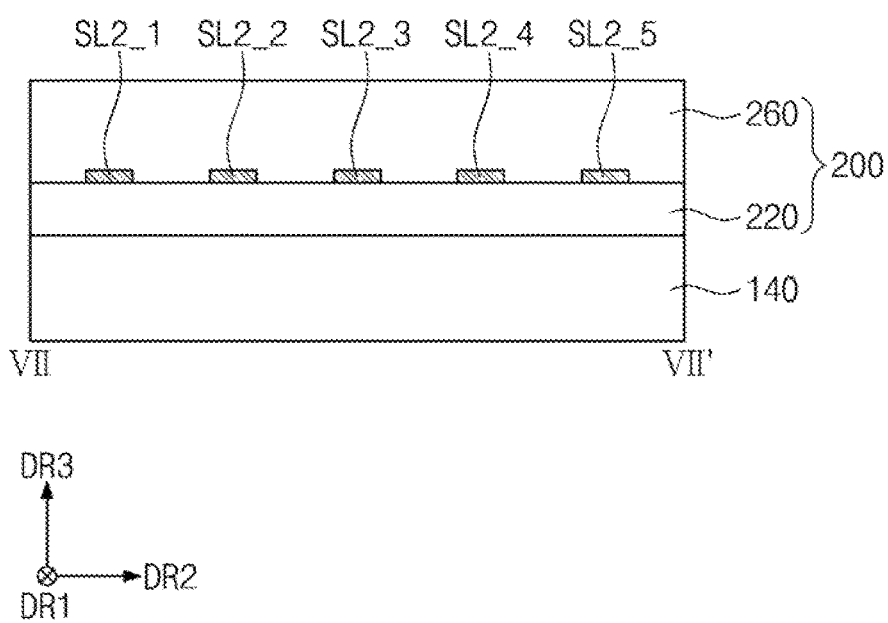
FIG. 19B is a cross-sectional view taken along line VII-VII' in FIG. 18.
Figure 20:
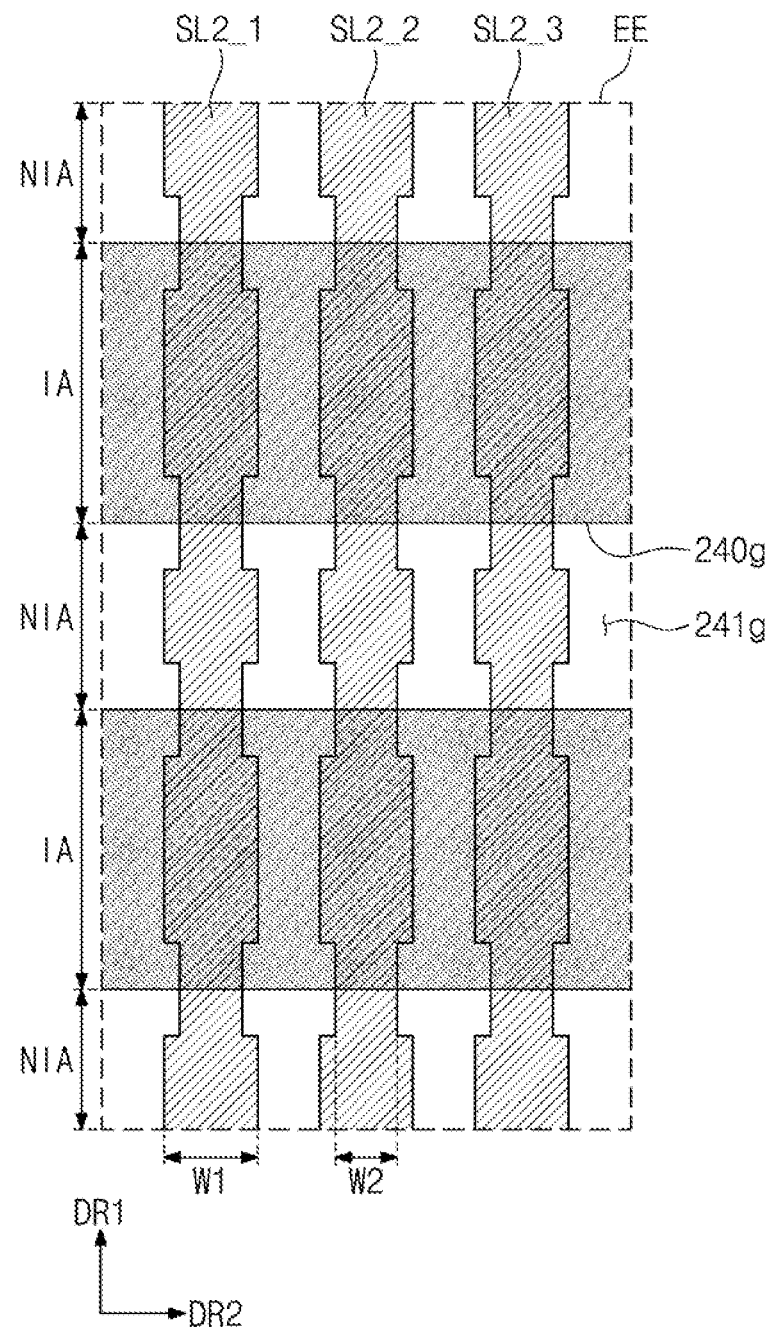
FIG. 20 is an enlarged plan view of portion EE in FIG. 18 according to an embodiment of the present disclosure.

FIG. 17 is a plan view of an input sensor according to an embodiment of the present disclosure. FIG. 18 is an enlarged plan view of portion CC in FIG. 17 according to an embodiment of the present disclosure. FIG. 19A is a cross-sectional view taken along line VI-VI' in FIG. 18, and FIG. 19B is a cross-sectional view taken along line VII-VII' in FIG. 18. FIG. 20 is an enlarged plan view of portion EE in FIG. 18 according to an embodiment of the present disclosure. In FIGS. 17 to 20, the same reference numerals denote the same elements in FIGS. 5 to 16, and detailed descriptions of the same elements will be omitted.

Referring to FIGS. 17 and 18, in an embodiment, the input sensor 200 includes a sensing area 200A and a non-sensing area 200N. The sensing area 200A is activated in response to electrical signals and can sense an input. The non-sensing area 200N is an area in which no input is sensed and surrounds the sensing area 200A.

In an embodiment, each of the sensing area 200A and the non-sensing area 200N includes a plurality of first areas IA and a plurality of second areas NIA. The first areas IA are repeatedly arranged in the first direction DR1, and the second areas NIA are repeatedly arranged in the first direction DR1. The first direction DR1 is substantially parallel to the rolling direction of the display device DD. For example, the first areas IA are alternately arranged in the first direction DR1 with the second areas NIA.

In an embodiment, the first areas IA are where an inorganic insulating layer 240g is disposed, and the second areas NIA are where no inorganic insulating layer 240g is disposed. The inorganic insulating layer 240g includes second openings 241g in the second areas NIA that are formed by removing portions of the inorganic insulating layer 240g from the second areas NIA.

In an embodiment, a plurality of first signal lines are respectively connected to a plurality of first sensing electrodes TE1 to TE4, and a plurality of second signal lines SL2_1 to SL2_6 are respectively connected to the second sensing electrodes RE1 to RE6. The plurality of first signal lines and the plurality of second signal lines SL2_1 to SL2_6 are disposed in the non-sensing area 200N.

Referring to FIGS. 18 to 19B, in an embodiment, each of the second signal line SL2_1 to SL2_6 has a multi-layer structure in the first areas IA and a single-layer structure in the second areas NIA. That is, each of the second signal lines SL2_1 to SL2_6 includes a lower line LSL and an upper line USL in the first areas IA. The lower line LSL is disposed on an organic insulating layer 220, and the upper line USL is disposed on the inorganic insulating layer 240g. That is, the lower line LSL is disposed on the same layer as the first conductive layer 230, and the upper line USL is disposed on the same layer as the second conductive layer 250.

In the second areas NIA, in an embodiment, each of the second signal lines SL2_1 to SL2_6 includes only one of the lower line LSL and the upper line USL. Since the inorganic insulating layer 240g and the base insulating layer 210 are removed in the second areas NIA, the second signal lines SL2_1 to SL2_6 are disposed on the organic insulating layer 220.

In an embodiment, each of the second signal lines SL2_1 to SL2_6 has a structure in which the multi-layer structure and the single-layer structure are repeated in the rolling direction, however, embodiments of the present disclosure are not limited thereto. According to an embodiment, each of the second signal lines SL2_1 to SL2_6 has a single-layer structure in the entire second areas NIA.

Referring to FIGS. 18 to 20, in an embodiment, each of the second signal lines SL2_1 to SL2_6 has a width in the second direction DR2 that decreases at a boundary between the first and second areas IA and NIA. For example, each of the second signal lines SL2_1 to SL2_6 has a first line width W1 in the second direction DR2 in a first portion and a second line width W2 in the second direction DR2 in a second portion. The first portion overlaps a center portion of each of the first and second areas IA and NIA, and the second portion overlaps the boundary between the first and second areas IA and NIA. In a present embodiment, the first line width W1 is greater than the second line width W2.

In an embodiment, a step difference occurs between the inorganic insulating layer 240g and the organic insulating layer 220 at the boundary between the first and second areas IA and NIA. In a process of patterning the second signal lines SL2_1 to SL2_6, the second signal lines SL2_1 to SL2_6 can be prevented from short-circuiting due to the step difference between the inorganic insulating layer 240g and the organic insulating layer 220.

However, embodiments of the present disclosure are not limited thereto. For example, when the inorganic insulating layer 240g and the base insulating layer 210 are entirely removed from the second areas NIA, each of the second signal lines SL2_1 to SL2_6 has a constant line width.

Although embodiments of the present disclosure have been described, it is understood that embodiments of the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A display device, comprising:
   a display panel; and
   an input sensor disposed on the display panel, wherein the input sensor includes:
      a plurality of first areas repeatedly arranged in a first direction;
      a plurality of second areas repeatedly arranged in the first direction;
      an inorganic insulating layer disposed in the first areas, but not in the second areas;
      an organic insulating layer disposed in the first areas, and in the second areas; and
      a sensing electrode disposed on the organic insulating layer and the inorganic insulating layer,
      wherein the first areas are alternately arranged in the first direction with the second areas, and
      the input sensor includes openings in the second areas that are formed by removing portions of the inorganic insulating layer from the second areas, and
      the sensing electrode includes
         an upper sensing portion disposed on the inorganic insulating layer in a corresponding first area of the plurality of first areas, and
         a lower sensing portion that extends from the upper sensing portion and is disposed on the organic insulating layer in a corresponding second area of the plurality of second areas, in an area where the inorganic insulating layer is not disposed,
      wherein the display device is rolled in a first direction and the openings are repeatedly arranged in the first direction, and
      each of the openings extends along a second direction that crosses the first direction.

2. The display device of claim 1, wherein the sensing electrode comprises:
   a plurality of first sensing electrodes; and
   a plurality of second sensing electrodes, wherein the plurality of second sensing electrodes are insulated from the plurality of first sensing electrodes when crossing the first sensing electrodes.

3. The display device of claim 2, wherein each of the first sensing electrodes comprises:
   a plurality of first sensing portions; and
   a bridge portion that connects two adjacent first sensing portions of the plurality of first sensing portions, and
   each of the second sensing electrodes comprises:
   a plurality of second sensing portions; and
   an extension portion that extends between two adjacent second sensing portions of the plurality of second sensing portions.

4. The display device of claim 3, wherein the input sensor comprises:
   a first conductive layer disposed on the organic insulating layer; and
   a second conductive layer disposed on the inorganic insulating layer.

5. The display device of claim 4, wherein
   the bridge portion is formed from the first conductive layer, and the first sensing portions, the second sensing portions, and
   the extension portion are formed from the second conductive layer.

6. The display device of claim 4, wherein
   the bridge portion is formed from the first conductive layer, and
   the extension portion is formed from the second conductive layer.

7. The display device of claim 6, wherein
   at least one of the first sensing portions comprises:
      a first upper sensing portion disposed in a corresponding first area of the plurality of first areas; and
      a first lower sensing portion disposed a corresponding second area of the plurality of second areas, and
   at least one of the second sensing portions comprises:
      a second upper sensing portion disposed in a corresponding first area of the plurality of first areas; and
      a second lower sensing portion disposed in a corresponding second area of the plurality of second areas.

8. The display device of claim 7, wherein
   the first and second lower sensing portions are formed from the first conductive layer, and the first and second upper sensing portions are formed from the second conductive layer.

9. The display device of claim 7, wherein
the first lower sensing portion overlaps the first upper sensing portion in the corresponding first area, and
the second lower sensing portion overlaps the second upper sensing portion in the corresponding first area.

10. The display device of claim 7, wherein
the first lower sensing portion is electrically connected to the first upper sensing portion, and
the second lower sensing portion is electrically connected to the second upper sensing portion.

11. The display device of claim 1, wherein the input sensor further comprises a second inorganic insulating layer that overlaps the second areas.

12. The display device of claim 11, wherein the second inorganic insulating layer is spaced apart from the inorganic insulating layer in the second areas.

13. The display device of claim 11, wherein the third inorganic insulating layer extends from the second inorganic insulating layer and is integrally formed with the second inorganic insulating layer.

14. The display device of claim 1, wherein the inorganic insulating layer comprises a side surface in the opening, and the side surface has an inclined surface.

15. The display device of claim 1, wherein the input sensor further comprises a base insulating layer disposed between the organic insulating layer and the display panel.

16. The display device of claim 15, wherein the base insulating layer comprises an inorganic material, and the base insulating layer includes openings that correspond to the second areas.

17. The display device of claim 1, wherein the display panel comprises:
a light emitting element layer that includes a light emitting element; and
an encapsulation layer disposed on the light emitting element layer.

18. The display device of claim 17, wherein the encapsulation layer comprises:
a first inorganic layer;
an organic layer disposed on the first inorganic layer; and
a second inorganic layer disposed on the organic layer.

19. The display device of claim 18, wherein one of the first and second inorganic layers include openings that correspond to the second areas.

* * * * *